United States Patent
Lim et al.

(10) Patent No.: US 10,887,536 B2
(45) Date of Patent: Jan. 5, 2021

(54) IMAGE SENSOR WITH REDUCED NOISE

(71) Applicant: SAMSUNG ELECTRONICS CO., LTD., Suwon-si (KR)

(72) Inventors: Jung Wook Lim, Hwaseong-si (KR); Eun Sub Shim, Hwaseong-si (KR); Kyung Ho Lee, Suwon-si (KR)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 128 days.

(21) Appl. No.: 16/115,987

(22) Filed: Aug. 29, 2018

(65) Prior Publication Data

US 2019/0222781 A1 Jul. 18, 2019

(30) Foreign Application Priority Data

Jan. 12, 2018 (KR) .................. 10-2018-0004618

(51) Int. Cl.
| | |
|---|---|
| *H04N 5/225* | (2006.01) |
| *H04N 5/357* | (2011.01) |
| *H01L 27/146* | (2006.01) |
| *H04N 5/355* | (2011.01) |
| *H04N 5/378* | (2011.01) |

(52) U.S. Cl.
CPC ......... *H04N 5/357* (2013.01); *H01L 27/1461* (2013.01); *H01L 27/14601* (2013.01); *H01L 27/14609* (2013.01); *H01L 27/14612* (2013.01); *H01L 27/14616* (2013.01); *H01L 27/14636* (2013.01); *H01L 27/14641* (2013.01); *H01L 27/14643* (2013.01); *H04N 5/3559* (2013.01); *H04N 5/3577* (2013.01); *H04N 5/378* (2013.01)

(58) Field of Classification Search
None
See application file for complete search history.

(56) References Cited

U.S. PATENT DOCUMENTS

| | | | |
|---|---|---|---|
| 8,426,796 B2 | 4/2013 | Mao et al. | |
| 9,083,902 B2 | 7/2015 | Masagaki et al. | |
| 9,491,386 B2 | 11/2016 | Chen et al. | |
| 10,103,193 B1* | 10/2018 | Manabe | ............ H01L 27/14643 |
| 2007/0147132 A1* | 6/2007 | Lee | ...................... H04N 3/1568 365/185.23 |

(Continued)

FOREIGN PATENT DOCUMENTS

JP 5895525 3/2016

*Primary Examiner* — Twyler L Haskins
*Assistant Examiner* — Dwight Alex C Tejano
(74) *Attorney, Agent, or Firm* — F. Chau & Associates, LLC

(57) ABSTRACT

An image sensor includes a photoelectric conversion unit configured to receive light to generate an electric charge and provide the electric charge to a first node, a transfer transistor configured to provide a voltage level of the first node to a floating diffusion node in response to a first signal, a booster configured to increase a voltage level of the floating diffusion node in response to a second signal, a source follower transistor configured to provide the voltage level of the floating diffusion node to a second node, and a selection transistor configured to provide a voltage level of the second node to a pixel output terminal in response to a third signal. After the selection transistor is turned on, the booster is enabled, and before the transfer transistor is turned on, the booster is disabled.

20 Claims, 22 Drawing Sheets

(56) References Cited

U.S. PATENT DOCUMENTS

| | | | |
|---|---|---|---|
| 2009/0272879 A1* | 11/2009 | Dai | H04N 5/3559 250/208.1 |
| 2011/0036969 A1* | 2/2011 | Ahn | H01L 27/14609 250/208.1 |
| 2013/0009043 A1* | 1/2013 | Mao | H04N 5/35509 250/208.1 |
| 2017/0070691 A1* | 3/2017 | Nishikido | H04N 5/35581 |
| 2017/0078594 A1* | 3/2017 | Kawabata | H04N 5/3535 |
| 2017/0126997 A1* | 5/2017 | Ha | H04N 5/3591 |
| 2017/0223297 A1 | 8/2017 | Kawaguchi | |
| 2017/0237922 A1 | 8/2017 | Kim et al. | |

* cited by examiner

IMAGE SENSOR WITH REDUCED NOISE

CROSS-REFERENCE TO RELATED APPLICATION

This application claims priority under 35 U.S.C. § 119 to Korean Patent Application No. 10-2018-0004618, filed on Jan. 12, 2018 in the Korean Intellectual Property Office, the disclosure of which is incorporated by reference herein in its entirety.

TECHNICAL FIELD

Exemplary embodiments of the present inventive concept relate to an image sensor, and more particularly, to an image sensor with reduced noise.

DISCUSSION OF RELATED ART

An image sensor converts optical images into electric signals. Due to recent developments in the computer and communication industries, demands for image sensors with improved performance have increased for various devices, such as digital cameras, video cameras, Personal Communication Systems (PCS), gaming devices, security cameras, medical microcontrollers, robots, etc.

In a pixel having a structure using multiple photodiodes, an output voltage of a first channel tends to be relatively high. This is due to a Random Telegraph Signal (RTS) noise generated by an electronic trap/de-trap of a source follower transistor.

SUMMARY

According to an exemplary embodiment of the present inventive concept, an image sensor includes a photoelectric conversion unit configured to receive light to generate an electric charge and provide the electric charge to a first node, a transfer transistor configured to provide a voltage level of the first node to a floating diffusion node in response to a first signal, a booster configured to increase a voltage level of the floating diffusion node in response to a second signal, a source follower transistor configured to provide the voltage level of the floating diffusion node to a second node, and a selection transistor configured to provide a voltage level of the second node to a pixel output terminal in response to a third signal. After the selection transistor is turned on, the booster is enabled, and before the transfer transistor is turned on, the booster is disabled.

According to an exemplary embodiment of the present inventive concept, an image sensor includes a photoelectric conversion unit configured to receive light to generate an electric charge and provide the electric charge to a first node, a transfer transistor configured to provide a voltage level of the first node to a floating diffusion node in response to a first signal, a booster configured to increase a voltage level of the floating diffusion node in response to a second signal, a source follower transistor configured to provide the voltage level of the floating diffusion node to a second node, and a selection transistor configured to provide a voltage level of the second node to a pixel output terminal in response to a third signal. After the selection transistor is turned on, the booster is enabled, and before the transfer transistor is turned on, the booster is disabled. The image sensor may include a reset transistor configured to reset the floating diffusion node to a reference voltage level in response to a fourth signal, wherein the fourth signal is reduced earlier than a time point at which the third signal increases. The image sensor may be configured wherein the selection transistor is gated to a selection line, and the fourth signal is provided to the selection line.

According to an exemplary embodiment of the present inventive concept, an image sensor includes a first pixel which includes a first photoelectric conversion unit, a first floating diffusion node, and a first booster configured to boost the first floating diffusion node, a second pixel which includes a second photoelectric conversion unit, a second floating diffusion node, and a second booster configured to boost the second floating diffusion node, a correlated double sampler, and a pixel selection unit configured to select a pixel among one of the first and second pixels to provide an output voltage of the selected pixel to the correlated double sampler. If the selected pixel is the first pixel and before an output voltage of the first pixel is provided to the correlated double sampler, the first booster pre-boosts the first floating diffusion node. If the selected pixel is the second pixel and before an output voltage of the second pixel is provided to the correlated double sampler, the second booster pre-boosts the second floating diffusion node.

BRIEF DESCRIPTION OF THE DRAWINGS

The above and other features of the present inventive concept will become apparent and more readily appreciated by describing in detail exemplary embodiments thereof with reference to the accompanying drawings.

DETAILED DESCRIPTION OF THE EMBODIMENTS

Figure 1:
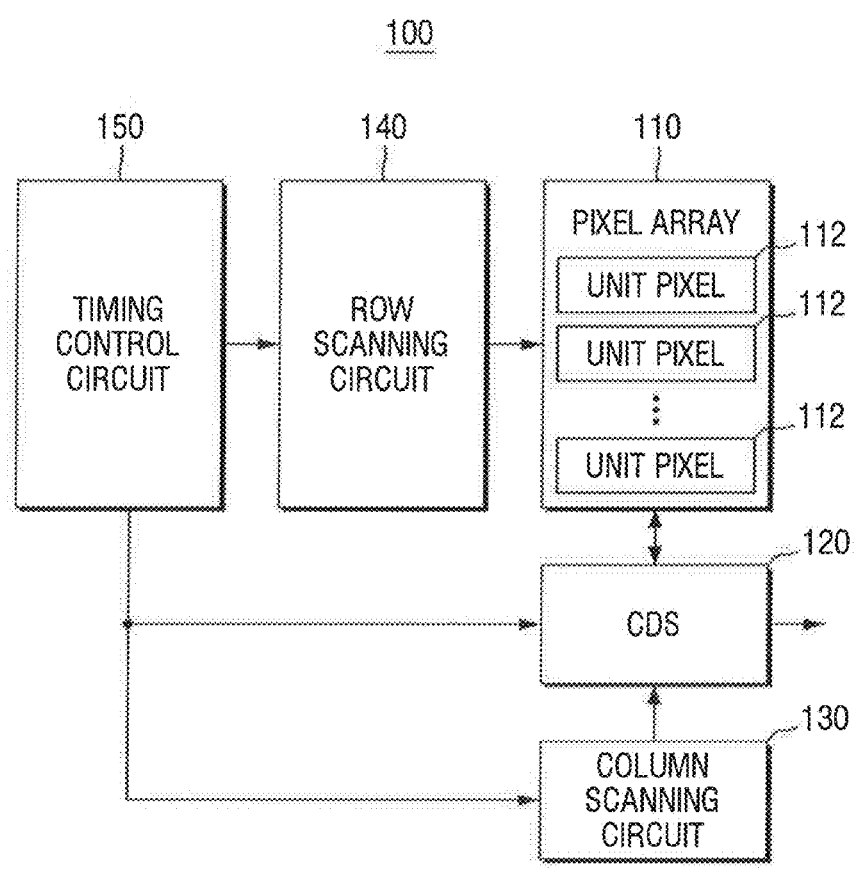
FIG. 1 is a block diagram for explaining an image sensor according to an exemplary embodiment of the present inventive concept.

Exemplary embodiments of the present inventive concept provide an image sensor with reduced noise.

Exemplary embodiments of the present inventive concept will be described more fully hereinafter with reference to the accompanying drawings. Like reference numerals may refer to like elements throughout this application.

FIG. 1 is a block diagram for explaining an image sensor according to an exemplary embodiment of the present inventive concept.

Referring to FIG. 1, an image sensor 100 according to an exemplary embodiment of the present inventive concept may include a pixel array 110, a correlated double sampler (CDS) 120, a column scanning circuit 130, a row scanning circuit 140, and a timing control circuit 150.

The pixel array 110 may include a plurality of unit pixels 112. The plurality of unit pixels 112 may be arranged in a matrix form.

The unit pixel 112 may be classified into a three-transistor structure, a four-transistor structure, a five-transistor structure, or a six-transistor structure, depending on the number of transistors included in a signal generation circuit.

The pixel array 110 may have a row selection line wired for each row, and a column selection line wired for each column. For example, when the pixel array includes M*N (where M and N are integers greater than 1) pixels, M row selection lines and N column selection lines may be wired in the pixel array 110.

In an exemplary embodiment of the present inventive concept, if the image sensor 100 adopts a Bayer pattern, the pixels in the pixel array 110 may be configured to receive red (R) light, green (G) light, and blue light (B). Alternatively, the pixels may be configured to receive magenta (M) light, yellow (Y) light, cyan (C) light, and/or white (W) light. However, the present inventive concept is not limited thereto.

The CDS 120 may include a number of analog to digital converters (ADC), including a comparator, a counter, and a latch.

The CDS 120 may be controlled by the timing control circuit 150. The operation of the CDS 120 may be performed for each cycle during which the row scanning circuit 140 selects the row selection line of the pixel array 110, e.g., for each low scan cycle.

The row scanning circuit 140 may receive a control signal from the timing control circuit 150. The row scanning circuit 140 may control the row addressing and the row scanning of the pixel array 110, in response to the received control signal. At this time, to select a row selection line among the row selection lines, the row scanning circuit 140 may apply a signal that activates the selected row selection line to the pixel array 110. The row scanning circuit 140 may include a row decoder which selects the row selection line in the pixel array 110, and a row driver that provides the signal for activating the selected row selection line.

The column scanning circuit 130 may receive the control signal from the timing control circuit 150. The column scanning circuit 130 may control the column addressing and the column scanning of the pixel array 110, in response to the received control signal. At this time, the column scanning circuit 130 may output a digital output signal, which is output from the CDS 120, to a Digital Signal Processor (DSP), an Image Signal Processor (ISP), or an external host.

For example, the column scanning circuit 130 may sequentially select a number of ADCs in the CDS 120, by outputting a horizontal scan control signal to the CDS 120. In an exemplary embodiment of the present inventive concept, the column scanning circuit 130 may include a column decoder which selects one of the ADCs, and a column driver which induces the output of the selected unit ADC to a horizontal transfer line. The horizontal transfer line may have a bit width for outputting the digital output signal.

The timing control circuit 150 controls the column scanning circuit 130 and the row scanning circuit 140, and may supply control signals such as a clock signal and a timing control signal required for different operations. The timing control circuit 150 may include a logic control circuit, a phase lock loop (PLL) circuit, a timing control circuit, and a communication interface circuit.

Figure 2:
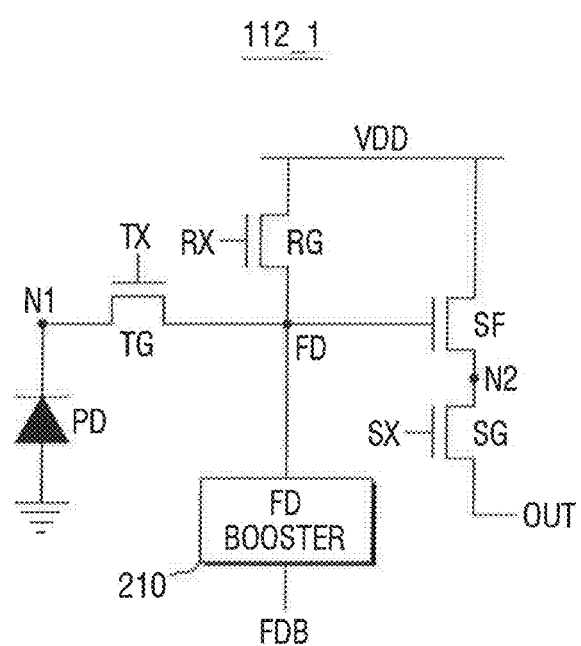
FIG. 2 is a circuit diagram for explaining unit pixels of the image sensor of FIG. 1 according to an exemplary embodiment of the present inventive concept.

FIG. 2 is a circuit diagram for explaining unit pixels of the image sensor of FIG. 1 according to an exemplary embodiment of the present inventive concept.

Referring to FIG. 2, a unit pixel 112_1 according to an exemplary embodiment of the present inventive concept includes a photoelectric conversion unit (PD), a transfer transistor (TG), a reset transistor (RG), a source follower transistor (SF), a selection transistor (SG), and a booster (FD BOOSTER) 210.

According to an exemplary embodiment of the present inventive concept, one end of the photoelectric conversion unit (PD) may be connected to the first node (N1), and the other end may be, for example, connected to ground.

The photoelectric conversion unit (PD) may generate photoelectric charges by receiving a light which are incident from the outside. In other words, the photoelectric conversion unit (PD) receives the light and may convert an optical signal into an electric signal. The photoelectric conversion unit (PD) may provide the converted electric signal to the first node (N1). When the amount of light received from the outside is relatively large, the photoelectric conversion unit (PD) may generate a relatively large amount of charges.

In an exemplary embodiment of the present inventive concept, the photoelectric conversion unit (PD) may generate electrons, using the light incident from the outside. The generated electrons may be provided to the first node (N1). In other words, when the photoelectric conversion unit (PD) receives light from the outside, the voltage level of the first node (N1) may be lowered. For example, when the photoelectric conversion unit (PD) receives a relatively large amount of light, the voltage level of the first node (N1) may decrease relatively greatly.

In FIG. 2, the photoelectric conversion portion (PD) is illustrated by a symbol of a diode (photodiode), but this is for convenience of explanation, and the present inventive concept is not limited thereto. In addition to a photodiode, the photoelectric conversion unit (PD) may include, for example, a photo transistor, a photo gate, a pinned photodiode (PPD), an organic photodiode (OPD), a quantum dot (QD), or combinations thereof.

According to an exemplary embodiment of the present inventive concept, a source/drain terminal of the transfer transistor (TG) may be connected to the first node (N1) and a floating diffusion node (FD). A gate terminal of the transfer transistor (TG) may be connected to a transfer line.

In an exemplary embodiment of the present inventive concept, a transfer signal (TX) may be provided to the transfer line. In other words, the transfer signal (TX) may be provided to the gate terminal of the transfer transistor (TG). The transfer signal (TX) may control turning on/off of the transfer transistor (TG). The voltage level of the transfer signal (TX) may include, for example, a high level and a low level.

When the voltage level of the transfer signal (TX) is the high level, the transfer transistor (TG) may be turned on. When the voltage level of the transfer signal (TX) is the low level, the transfer transistor (TG) may be turned off.

When the transfer transistor (TG) is turned on, the first node (N1) and the floating diffusion node (FD) may be electrically connected to each other. In other words, when the transfer transistor (TG) is turned on, the voltage level of the first node (N1) may be applied to the floating diffusion node (FD). Therefore, when the transfer transistor (TG) is turned on, the voltage level of the first node (N1) changed by the photoelectric conversion unit (PD) may be applied to the floating diffusion node (FD).

For example, if there is no light received from the outside, the voltage level of the floating diffusion node (FD) may not decrease even if the transmit transistor (TG) is turned on. In a case where the light received by the photoelectric conversion unit (PD) is relatively small, when the transfer transistor (TG) is turned on, the voltage level of the floating diffusion node (FD) may decrease relatively slightly. On the other hand, in a case where the photoelectric conversion unit (PD) receives a relatively large amount of light, when the transfer transistor (TG) is turned on, the voltage level of the floating diffusion node (FD) may decrease relatively greatly.

The transfer transistor (TG) may be provided as an NMOS transistor, a PMOS transistor, or a CMOS transistor, but the present inventive concept is not limited thereto.

According to an exemplary embodiment of the present inventive concept, the reset transistor (RG) may be connected to the floating diffusion node (FD) and a first voltage source (VDD). The gate terminal of the reset transistor (RG) may receive a reset signal (RX).

The voltage level of the reset signal (RX) may include, for example, a high level and a low level. When the voltage level of the reset signal (RX) is the high level, the reset transistor (RG) may be turned on. When the voltage level of the reset signal (RX) is the low level, the reset transistor (RG) may be turned off.

When the reset transistor (RG) is turned on, the first voltage source (VDD) and the floating diffusion node (FD) may be electrically connected to each other. When the reset transistor (RG) is turned off, the first voltage source (VDD) and the floating diffusion node (FD) may be electrically separated from each other. In other words, when the reset transistor (RG) is turned on, the voltage level of the first voltage source (VDD) may be applied to the voltage level of the floating diffusion node (FD). Hereinafter, the voltage level of the first voltage source (VDD) is referred to a reference voltage level (VDD), and the same reference numeral as that of the first voltage source (VDD) is used.

When the reset transistor (RG) is turned on, the floating diffusion node (FD) may be reset to the reference voltage level (VDD). In an exemplary embodiment of the present inventive concept, the voltage level of the first node (N1) may be lowered depending on the amount of light received by the photoelectric conversion unit (PD). At this time, when the transfer transistor (TG) is turned on, the voltage level of the floating diffusion node (FD) may be lowered. When the reset transistor (RG) is turned on, the voltage level of the floating diffusion node (FD) may be increased again to the reference voltage level (VDD).

The reset transistor (RG) may be provided as an NMOS transistor, a PMOS transistor, or a CMOS transistor, but the present inventive concept is not limited thereto.

According to an exemplary embodiment of the present inventive concept, the source follower transistor (SF) may be connected to a second node (N2) and the first voltage source (VDD). The source follower transistor (SF) may be gated to the floating diffusion node (FD).

In an exemplary embodiment of the present inventive concept, the source follower transistor (SF) may provide a specific voltage level to the second node (N2), depending on the voltage level of the floating diffusion node (FD).

In an exemplary embodiment of the present inventive concept, the range of voltage level of the floating diffusion node (FD) may be within the range of a saturation region of the source follower transistor (SF). In other words, the source follower transistor (SF) may always be turned on. Additionally, the drain-source current of the source follower transistor (SF) may always be constant.

In an exemplary embodiment of the present inventive concept, the source follower transistor (SF) may operate as a common drain amplifier. In other words, the source follower transistor (SF) may operate as a voltage buffer. In an exemplary embodiment of the present inventive concept, the voltage level of the floating diffusion node (FD) may be transmitted to the second node (N2) as is.

In an exemplary embodiment of the present inventive concept, the unit pixel 112_1 may further include a shutter transistor connected to the first node (N1) and the first voltage source (VDD).

In an exemplary embodiment of the present inventive concept, the reset transistor (RG) and the source follower transistor (SF) have been described as being connected to the first voltage source (VDD), but the present inventive concept is not limited thereto. For example, the reset transistor (RG) and the source follower transistor (SF) may be connected to different voltage sources from each other.

According to an exemplary embodiment of the present inventive concept, the selection transistor (SG) may be connected to an output terminal (OUT) of the unit pixel 112_1 and the second node (N2). The selection transistor (SG) may be gated by a selection signal (SX).

The voltage level of the selection signal (SX) may include, for example, a high level and a low level. If the voltage level of the selection signal (SX) is the high level, the selection transistor (SG) may be turned on. If the voltage level of the selection signal (SX) is the low level, the selection transistor (SG) may be turned off.

When the selection transistor (SG) is turned on, the second node (N2) and the output terminal (OUT) of the unit pixel 112_1 may be electrically connected to each other. In other words, when the selection transistor (SG) is turned on, the voltage level of the second node (N2) may be applied to the output terminal (OUT) of the unit pixel 112_1.

The output terminal of the booster 210 may be connected to the floating diffusion node (FD). The input terminal of the booster 210 may receive a boosting signal (FDB).

The voltage level of the boosting signal (FDB) may include, for example, a high level and a low level. When the voltage level of the boosting signal (FDB) is the high level, the voltage level of the floating diffusion node (FD) may temporarily increase. This will be described in detail with reference to FIG. 3.

Figure 3:
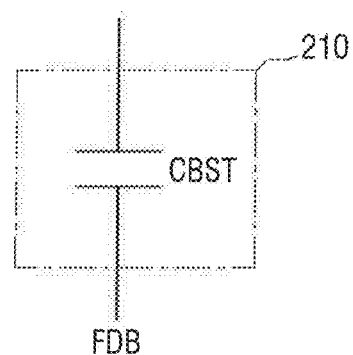
FIG. 3 is a diagram for illustrating a booster according to an exemplary embodiment of the present inventive concept.

FIG. 3 is a diagram for illustrating a booster according to an exemplary embodiment of the present inventive concept.

Referring to FIG. 3, the booster 210 according to an exemplary embodiment of the present inventive concept may include a capacitor (CBST). When the voltage level of the boosting signal (FDB) increases, the floating diffusion node (FD) and the booster 210 are coupled by the capacitor (CBST), and the voltage level of the floating diffusion node (FD) may temporarily increase. However, the present inventive concept is not limited thereto. The booster 210 may be implemented in various ways to temporarily raise the voltage level of the floating diffusion node (FD).

Figure 4:
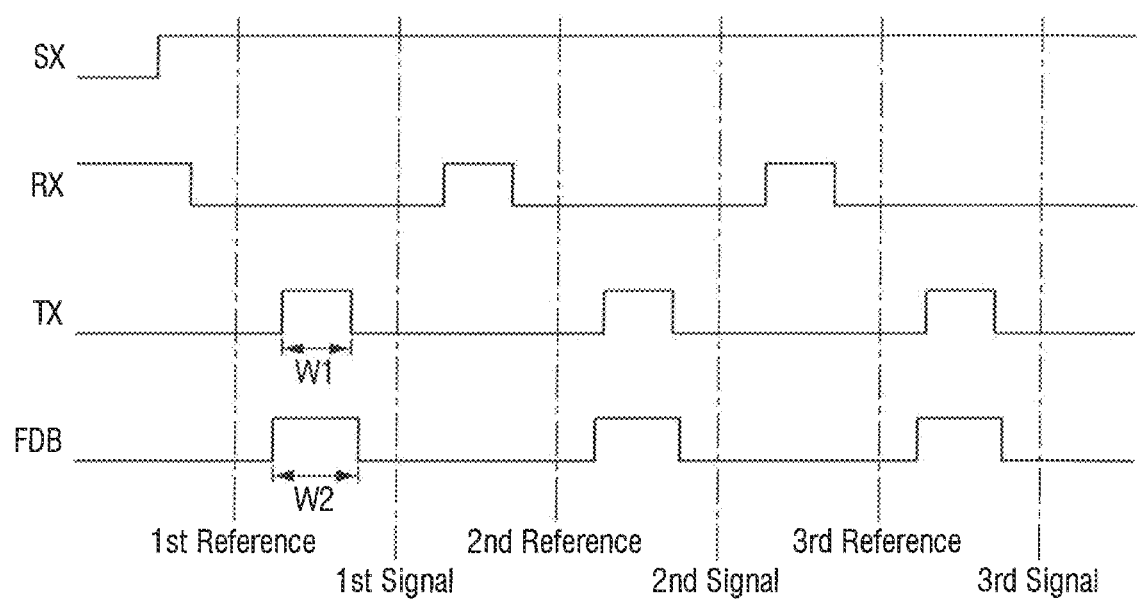
FIG. 4 is a timing diagram for explaining Random Telegraph Signal (RTS) noise of an image sensor according to an exemplary embodiment of the present inventive concept.
Figure 5:
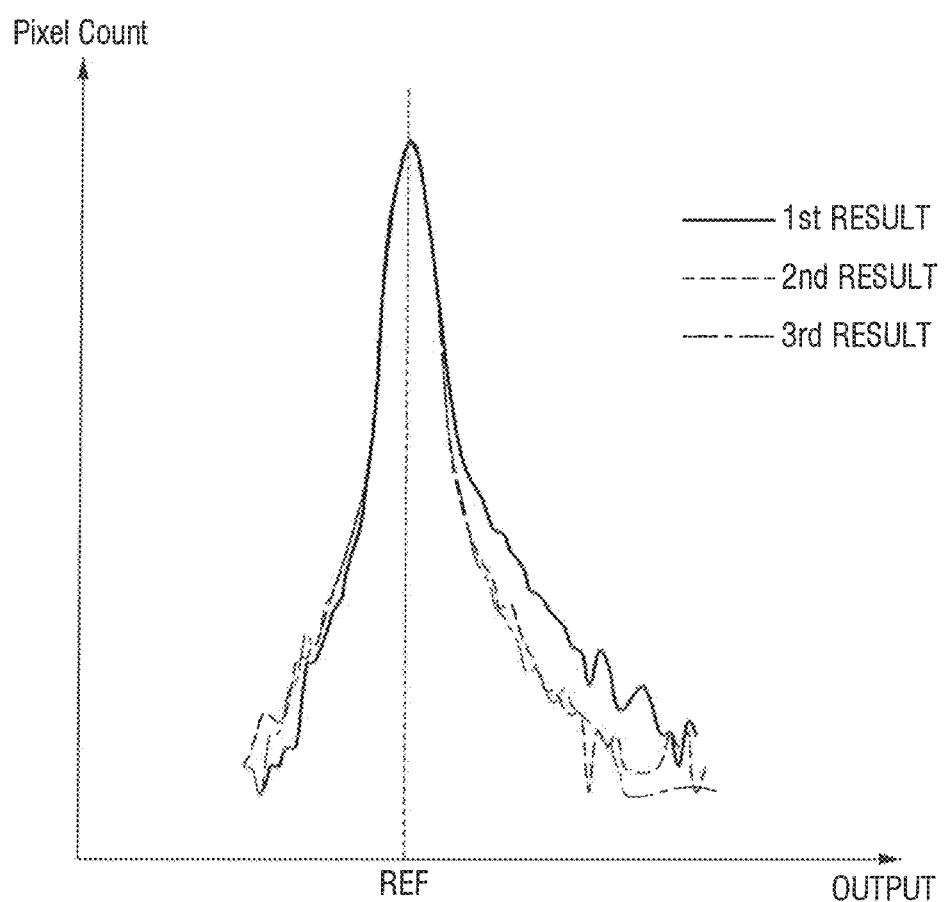
FIG. 5 is a graph for explaining the RTS noise of the image sensor of FIG. 4 according to an exemplary embodiment of the present inventive concept.

FIG. 4 is a timing diagram for explaining Random Telegraph Signal (RTS) noise of an image sensor according to an exemplary embodiment of the present inventive concept. FIG. 5 is a graph for explaining the RTS noise of the image sensor of FIG. 4 according to an exemplary embodiment of the present inventive concept. FIGS. 6A to 6D are diagrams for explaining the RTS noise of the image sensor of FIG. 4 according to an exemplary embodiment of the present inventive concept.

Random Telegraph Signal (RTS) noise of the image sensor will be described with reference to FIGS. 4 and 5.

FIGS. 4 and 5 illustrate an operation timing diagram and output values of each of unit pixels when light of the same light quantity is irradiated to each of the unit pixels included in a pixel array. For convenience of explanation, FIGS. 4 and 5 illustrate RTS noise by comparing the operation of the unit pixel 112_1 with the output value when the same light is measured three times.

Referring to FIGS. 1, 2, and 4, the selection transistor (SG) may be turned on. In other words, the voltage level of the selection signal (SX) changes from the low level to the high level. The selection transistor (SG) may be maintained in the turned-on state until all outputs of the unit pixel 112_1 are measured. In other words, the voltage level of the selection signal (SX) may be kept at a high level until all outputs of the unit pixel 112_1 are measured.

Subsequently, the reset transistor (RG) may be turned off. In other words, the voltage level of the reset signal (RX) changes from the high level to the low level. At this time, the voltage level of the floating diffusion node (FD) may be provided to the CDS 120 by the output of the unit pixel 112_1. The voltage level of the floating diffusion node (FD) provided to the CDS 120 may be a first reference voltage (1st Reference).

Subsequently, the transfer transistor (TG) may be turned on. In other words, the voltage level of the transfer signal (TX) changes from the low level to the high level. At this time, the first node (N1) and the floating diffusion node (FD) may be electrically connected to each other. Therefore, the voltage level of the first node (N1) may be applied to the floating diffusion node (FD). At this time, the booster 210 may operate. In other words, the boosting signal (FDB) may be changed from the low level to the high level. In an exemplary embodiment of the present inventive concept, the booster 210 may boost the voltage of the floating diffusion node (FD). When the voltage level of the floating diffusion node (FD) increases, more charges accumulated at the first node (N1) may be provided to the floating diffusion node (FD). In other words, the booster 210 may help the voltage level of the first node (N1) to be well provided to the floating diffusion node (FD).

At this time, the voltage level of the floating diffusion node (FD) may be provided to the CDS 120 by the output of the unit pixel 112_1. The voltage level of the floating diffusion node (FD) provided to the CDS 120 may be a first signal voltage (1st Signal). The CDS 120 compares the first reference voltage (1st Reference) with the first signal voltage (1st Signal) and may output it as a digital code. The output of each of the unit pixels 112_1 included in the pixel array 110 may be plotted with a first result value (1st RESULT of FIG. 5). The process up to this point is referred to as a first measurement.

Subsequently, the reset transistor (RG) may be turned on. At this time, the voltage level of the floating diffusion node (FD) may be reset to the reference voltage level (VDD). The above process may be repeated again. In other words, the CDS 120 compares a second reference voltage (2nd Reference) with a second signal voltage (2nd Signal), and may output it as a digital code. This may be plotted with a second result value of FIG. 5 (2nd RESULT in FIG. 5), which may be referred to a second measurement. Similarly, by comparing a third reference voltage (3rd Reference) with a third signal voltage (3rd Signal), a third result value of FIG. 5 (3rd RESULT of FIG. 5) may be plotted, which may be referred to as a third measurement.

In an exemplary embodiment of the present inventive concept, a pulse width (W1) of the transfer signal (TX) may be smaller than a pulse width (W2) of the boosting signal, but the present inventive concept is not limited thereto.

FIG. 5 is a graph illustrating the first result value (1st RESULT) through third result value (3rd RESULT). A vertical axis of the graph is the number of unit pixels (pixel count), and a horizontal axis is an output value (OUTPUT).

In theory, since light of the same light quantity is irradiated to the plurality of unit pixels 112_1; each unit pixel 112_1 should output the same value (REF). However, noise (e.g., thermal noise, RTS noise, etc.) may occur due to various external factors. Therefore, the output values of the plurality of unit pixels 112_2 may conform to the normal distribution as illustrated in FIG. 5.

Referring to FIG. 5, the first result value (1st RESULT) is further biased in a positive direction with respect to the horizontal axis (OUTPUT) of the graph, as compared to the second and third result values (2nd RESULT, 3rd RESULT). In other words, in the first measurement, a result of an aspect different from the second and third measurements may be derived. For example, in the first measurement, the possibility of the presence of the unit pixel 112_1 having a relatively high output voltage may be greater than the second and third measurements. In other words, in the first measurement, there may be a high probability that there are unit pixels 112_1 which output as if a smaller light quantity than the actually received light quantity is received. The reason why the first measurement illustrates a different aspect from the second and third measurements will be described with reference to FIGS. 6A to 6D.

In an exemplary embodiment of the present inventive concept, the Random Telegraph Signal (RTS) noise may be a phenomenon in which electrons in the channel region of the transistor are trapped or de-trapped in the dielectric layer of the transistor and the voltage level of the channel region fluctuates. A more detailed explanation will be provided with reference to FIGS. 6A to 6D. FIGS. 6A to 6D briefly illustrate the structure of the source follower transistor (SF).

Figure 6A:
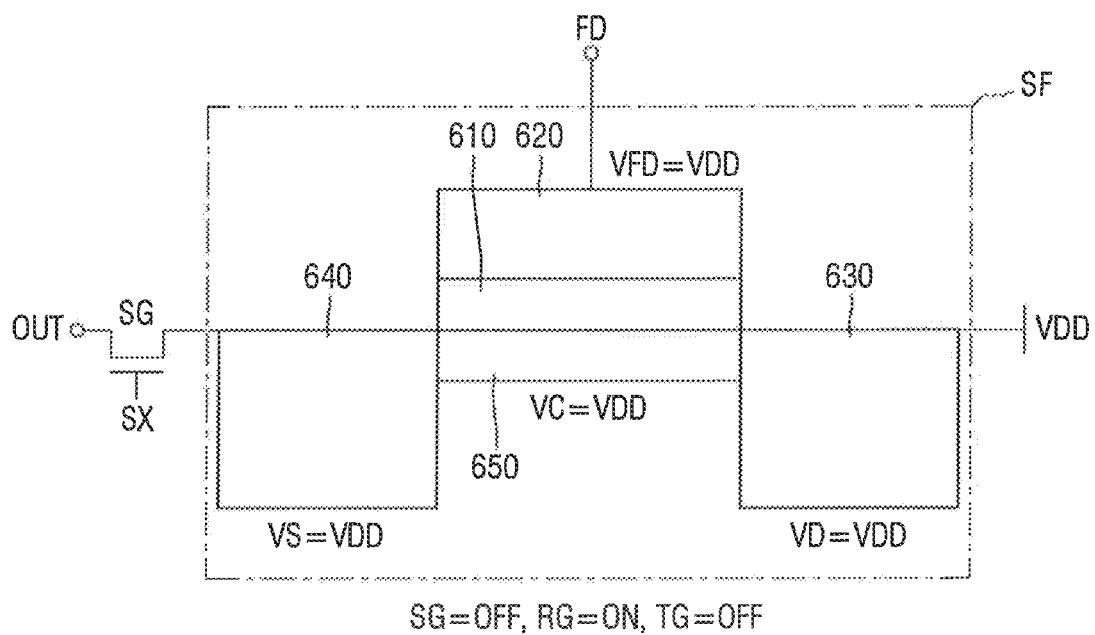
FIGS. 6A to 6D are diagrams for explaining the RTS noise of the image sensor of FIG. 4 according to an exemplary embodiment of the present inventive concept.

Referring to FIGS. 2, 4, and 6A, in the first measurement, the selection transistor (SG) may be in a turned-off state. In addition, the reset transistor (RG) may be in a turned-on state. In other words, the voltage level of the selection signal (SX) may be a low level, and the voltage level of the reset signal (RX) may be a high level.

Since the reset transistor (RG) is in the turned-on state, a voltage level (VFD) of a gate region 620 of the source follower transistor (SF) may be substantially the same as the reference voltage level (VDD).

A first source/drain region 630 of the source follower transistor (SF) may be connected to the first voltage source (VDD). Therefore, a voltage level (VD) of the first source/drain region 630 may be substantially the same as the reference voltage level (VDD).

Since the source follower transistor (SF) always operates in a stable region (saturation region) as described above, the voltage level (VFD) of the gate region 620 of the source follower transistor (SF) may form a channel region 650 between the first source/drain region 630 and a second source/drain region 640. When the channel region 650 is formed, the first source/drain region 630 and the second source/drain region 640 may be electrically connected to each other. Since the selection transistor (SG) is turned off, voltage levels (VS, VC) of the second source/drain region 640 and the channel region 650, respectively, may be substantially the same as the reference voltage level (VDD).

Therefore, the voltage level (VFD) of the gate region 620, the voltage levels (VD, VS) of the first and second source/drain regions 630 and 640, and the voltage level (VC) of the channel region 650 may be substantially the same as the reference voltage level (VDD). Therefore, it may be considered that a high voltage is applied to the voltage level (VFD) of the gate region 620, the voltage levels (VD, VS) of the first and second source/drain regions 630 and 640, and the voltage level (VC) of the channel region 650. As such, there may be almost no potential difference in the voltage level (VFD) of the gate region 620, the voltage levels (VD, VS) of the first and second source/drain regions 630 and 640, and the voltage level (VC) of the channel region 650. Therefore, a dielectric layer 610 (or dielectric film) of the source follower transistor (SF) may be in a state in which an electron 612 (illustrated in FIGS. 6C and 6D) is de-trapped. In other words, in a state in which the selection transistor SG is turned off, the reset transistor (RG) is turned on, and the transfer transistor TG is turned off, the dielectric layer 610 of the source follower transistor (SF) has a high probability in which the electron 612 is in the de-trapped state.

Figure 6B:
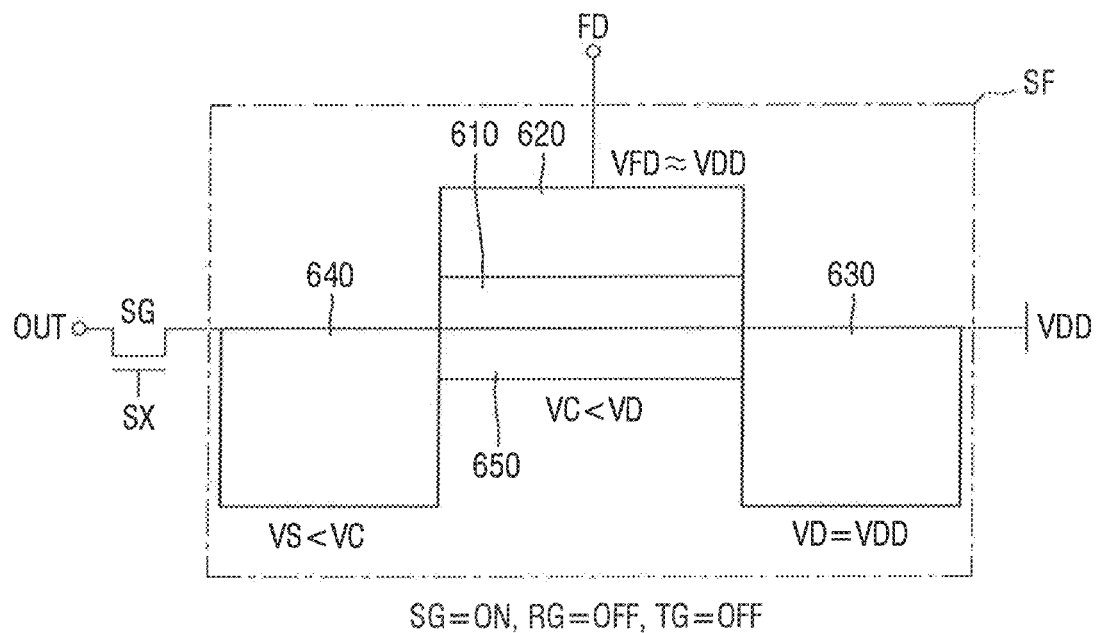

Referring to FIGS. 2, 4, and 6B, the selection transistor (SG) may be turned on and the reset transistor (RG) may be turned off. At this time, the transfer transistor (TG) may be in a turned-off state. In other words, the voltage level of the selection signal (SX) may increase from a low level to a high level. Further, the voltage level of the reset signal (RX) may decrease from a high level to a low level. Further, the voltage level of the transfer signal (TX) may be maintained at a low level.

Since the reset transistor (RG) is turned off, the gate region 620 of the source follower transistor (SF) may be floated. At this time, the voltage level (VFD) of the gate region 620 may be similar to the reference voltage level (VDD).

Since the first source/drain region 630 of the source follower transistor (SF) is connected to the first voltage source (VDD), the voltage level (VD) of the first source/drain region 630 may be substantially the same as the reference voltage level (VDD).

Since the selection transistor (SG) is turned on, the second source/drain region 640 may be connected to the output terminal (OUT) of the unit pixel 112_1. Therefore, a voltage drop may occur in the direction from the first source/drain region 630 to the second source/drain region 640. In other words, the voltage level (VC) of the channel region 650 may be smaller than the voltage level (VD) of the first source/drain region 630. In addition, the voltage level (VS) of the second source/drain region 640 may be smaller than the voltage level (VC) of the channel region 650. However, at this time, a potential difference in the voltage level (VFD) of the gate region 620, the voltage levels (VD, VS) of the first and second source/drain regions 630 and 640, and the voltage level (VC) of the channel region 650 may be relatively small. In this state, the probability that electrons 612 in the channel region 650 are trapped in the dielectric layer 610 may be, for example, 50%.

Figure 6C:
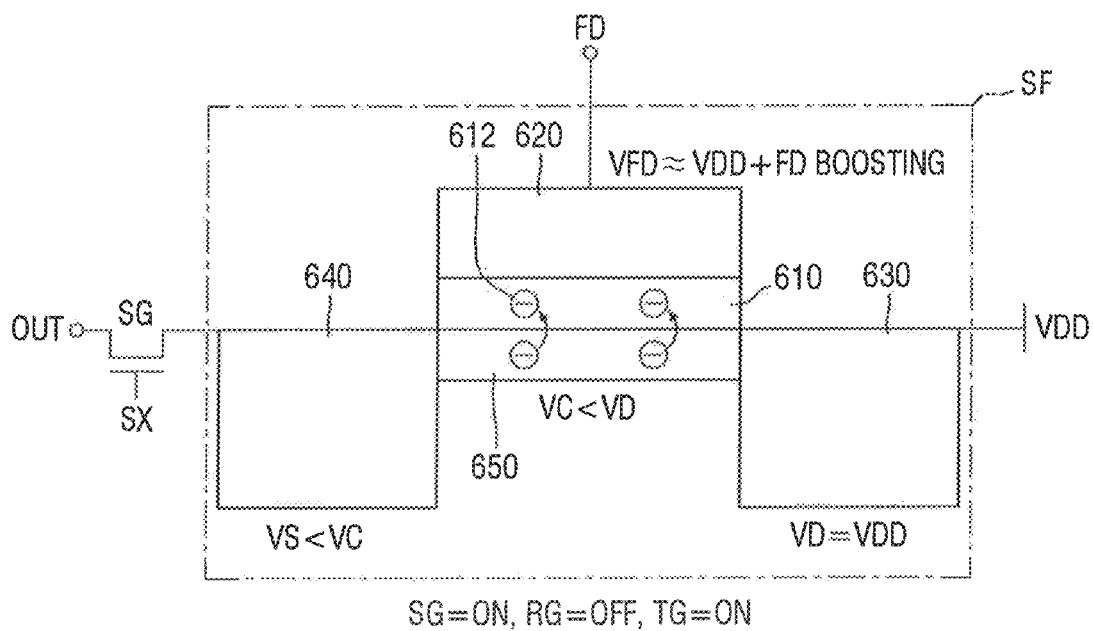

Referring to FIGS. 2, 4, and 6C, in the state of FIG. 6B, the transfer transistor (TG) may be turned on. In other words, the voltage level of the transfer signal (TX) may be increased from a low level to a high level. At this time, the booster 210 may increase the voltage of the floating diffusion node (FD). Therefore, the voltage level (VFD) of the gate region 620 may be close to the sum of the reference voltage level (VDD) and a voltage level (FD BOOSTING) increased by the booster 210. In other words, a voltage relatively higher than the voltage levels (VD, VS) of the first and second source/drain regions 630 and 640 and the voltage level (VC) of the channel region 650 may be applied to the gate region 620. When a high voltage is applied to the gate region 620, electrons 612 in the channel region 650 may be trapped in the dielectric layer 610. Since the electrons 612 in the channel region 650 are trapped in the dielectric layer 610, the voltage level transmitted to the output terminal (OUT) of the unit pixel 112_1 may become relatively high.

Figure 6D:
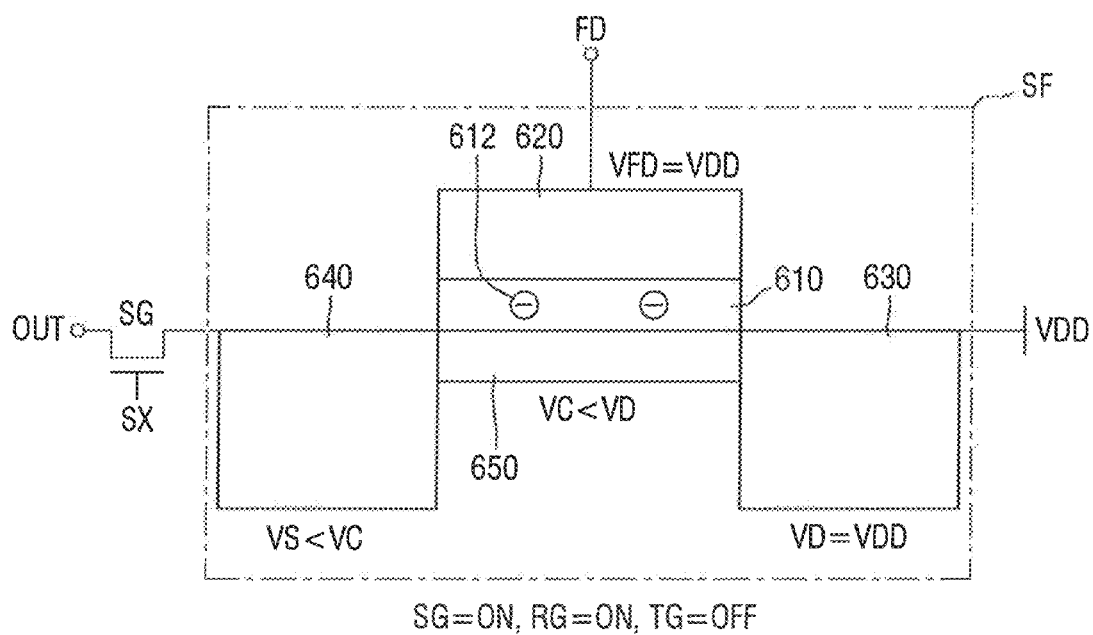

Referring to FIGS. 2, 4, and 6D, the transfer transistor TG may be turned off and the reset transistor (RG) may be turned on.

At this time, the voltage level (VFD) of the gate region 620 may be substantially the same as the reference voltage level (VDD). Further, the voltage level (VD) of the first source/drain region 630 may be substantially the same as the reference voltage level (VDD).

A voltage drop may occur in the direction from the first source/drain region 630 to the second source/drain region 640. In other words, the voltage level (VC) of the channel region 650 may be smaller than the voltage level (VD) of the first source/drain region 630. In addition, the voltage level (VS) of the second source/drain region 640 may be smaller than the voltage level (VC) of the channel region 650. However, at this time, the potential difference in the voltage level (VFD) of the gate region 620, the voltage levels (VD, VS) of the first and second source/drain regions 630 and 640, and the voltage level (VC) of the channel region 650 may be relatively small. In this state, the probability that electrons 612 in the channel region 650 are trapped in the dielectric layer 610 may be, for example, 50%.

Therefore, after the second measurement, the potential difference in the voltage level (VFD) of the gate region 620, the voltage levels (VD, VS) of the first and second source/drain regions 630 and 640, and the voltage level (VC) of the channel region 650 may be relatively small. As such, the probability that electrons 612 in the channel region 650 are trapped or de-trapped in the dielectric layer 610 may be, for example, 50%.

In an exemplary embodiment of the present inventive concept, when electrons 612 of the channel region 650 are trapped in the dielectric layer 610, the voltage level (VC) of the channel region 650 may increase. Since the voltage level (VC) of the channel region 650 increases, the voltage level (VS) of the second source/drain region 640 eventually increases, and the voltage level transmitted to the output terminal (OUT) of the unit pixel 112_1 may increase.

On the other hand, when the electrons 612 of the channel region 650 are de-trapped in the dielectric layer 610, the voltage level (VC) of the channel region 650 may decrease. Since the voltage level (VC) of the channel region 650 decreases, the voltage level (VS) of the second source/drain region 640 eventually decreases, and the voltage level transmitted to the output terminal (OUT) of the unit pixel 112_1 may decrease.

In an exemplary embodiment of the present inventive concept, after the second measurement, the probabilities that the electrons 612 are trapped/de-trapped in the dielectric layer 610 may be 50%. Therefore, the second result value (2nd RESULT) and the third result value (3rd RESULT) may be similar. However, as described above, in the first measurement, since the selection transistor (SG) is in a turned-off state, there is high probability that the electrons 612 are de-trapped. Therefore, when the transfer transistor (TG) is turned on, while electrons 612 are trapped in the dielectric layer 610, the voltage of the output stage (OUT) may decrease. Therefore, the first result value (1st RESULT) may be biased in the + direction as compared to the second and third result values (2nd RESULT, 3rd RESULT).

Figure 7:
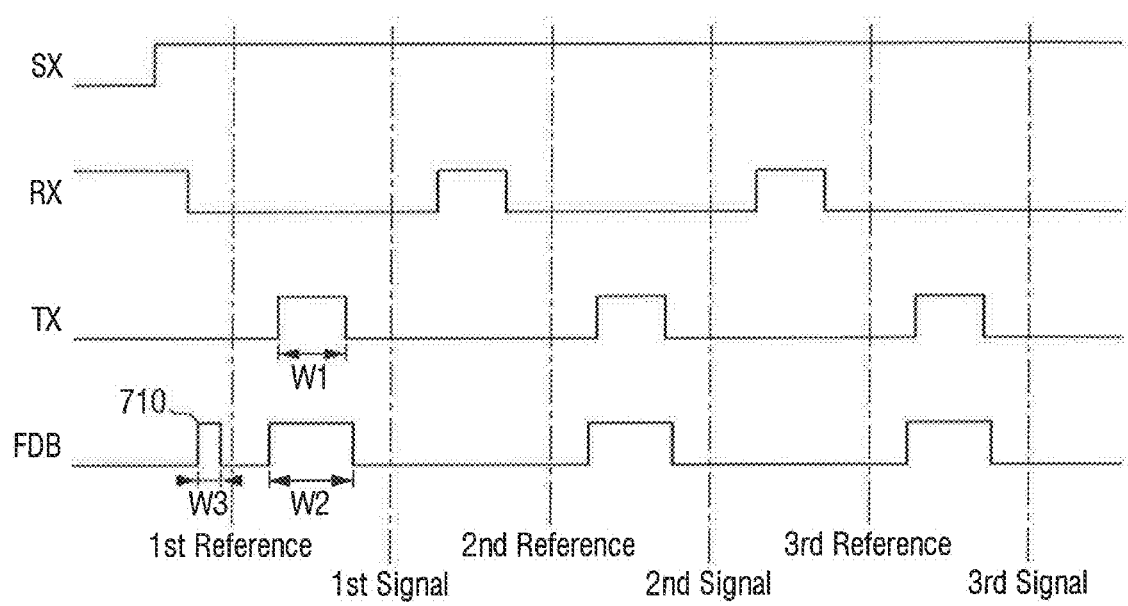
FIG. 7 is a diagram for describing a method for reducing RTS noise according to an exemplary embodiment of the present inventive concept.
Figure 8:
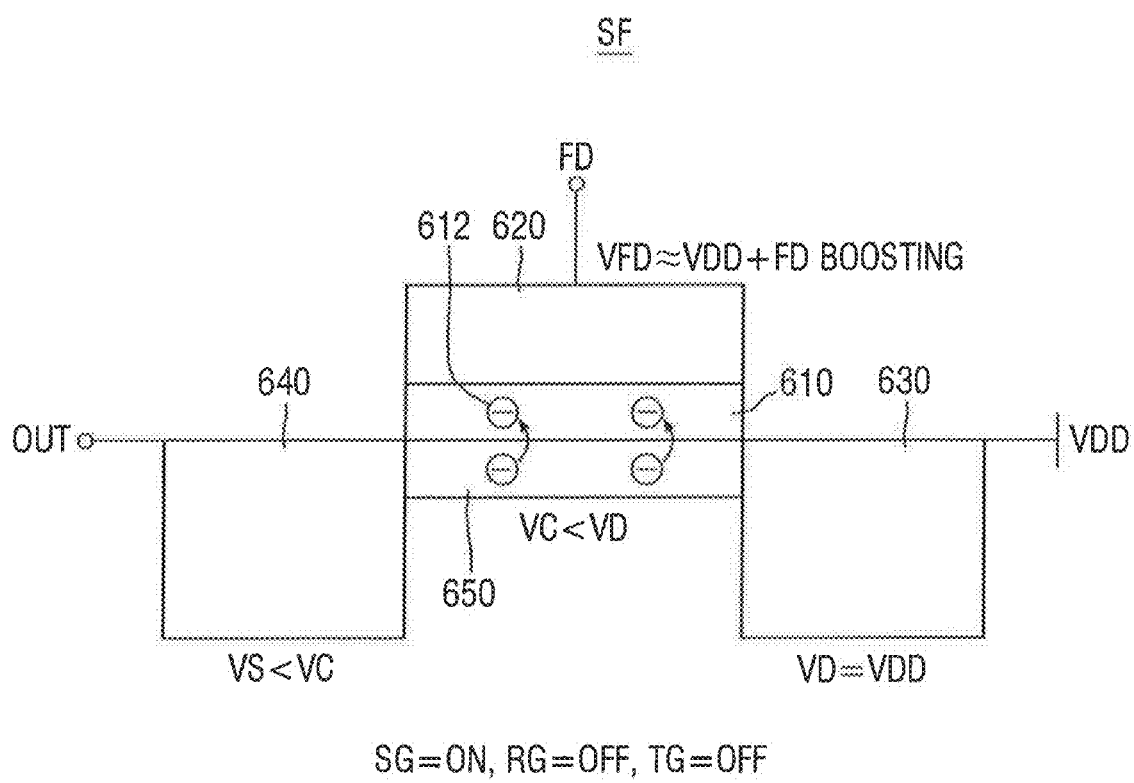
FIG. 8 is a timing diagram for describing a method for reducing RTS noise according to an exemplary embodiment of the present inventive concept.

FIG. 7 is a diagram for describing a method for reducing RTS noise according to an exemplary embodiment of the present inventive concept. FIG. 8 is a timing diagram for describing a method for reducing RTS noise according to an exemplary embodiment of the present inventive concept.

Referring to FIG. 7, after the selection transistor (SG) is turned on, the booster 210 may be enabled. Additionally, before the transfer transistor (TG) is turned on, the booster 210 may be disabled. In other words, after the voltage level of the selection signal (SX) changes from the low level to the high level, the voltage level of the boosting signal (FDB) may change from the low level to the high level. Further, before the voltage level of the transfer signal (TX) changes from the low level to the high level, the voltage level of the boosting signal (FDB) may change from the high level to the low level. For convenience, this is referred to as a pre-boosting pulse 710. A pulse width (W3) of the pre-boosting pulse 710 may be smaller than the boosting pulse width (W2), but is not limited thereto. For example, the pulse width (W3) of the pre-boosting pulse 710 may be substantially the same as W1 or W2.

Referring to FIG. 8, when the pre-boosting pulse 710 is executed after the selection transistor (SG) is turned on and before the transfer transistor (TG) is turned on, the voltage level (VFD) of the gate region 620 may be similar to the sum of the reference voltage level (VDD) and the voltage level (FD BOOSTING) increased by the booster 210. In other words, a voltage relatively higher than the voltage levels (VD, VS) of the first and second source/drain regions 630 and 640 and the voltage level (VC) of the channel region 650 may be applied to the gate region 620. When high voltage is applied to the gate region 620, electrons 612 in the channel region 650 may be trapped in the dielectric layer 610. Therefore, it is possible to condition a state in which the selection transistor (SG) is turned on, a state in which the reset transistor (RG) is turned off, and a state in which the electrons 612 are trapped in the dielectric layer 610. This may be similar to the state before the transfer transistor (TG) is turned on after the second measurement. Therefore, when performing the pre-boosting pulse 710, the measurement result values after the first measurement and the second measurement may illustrate a similar aspect.

Figure 9:
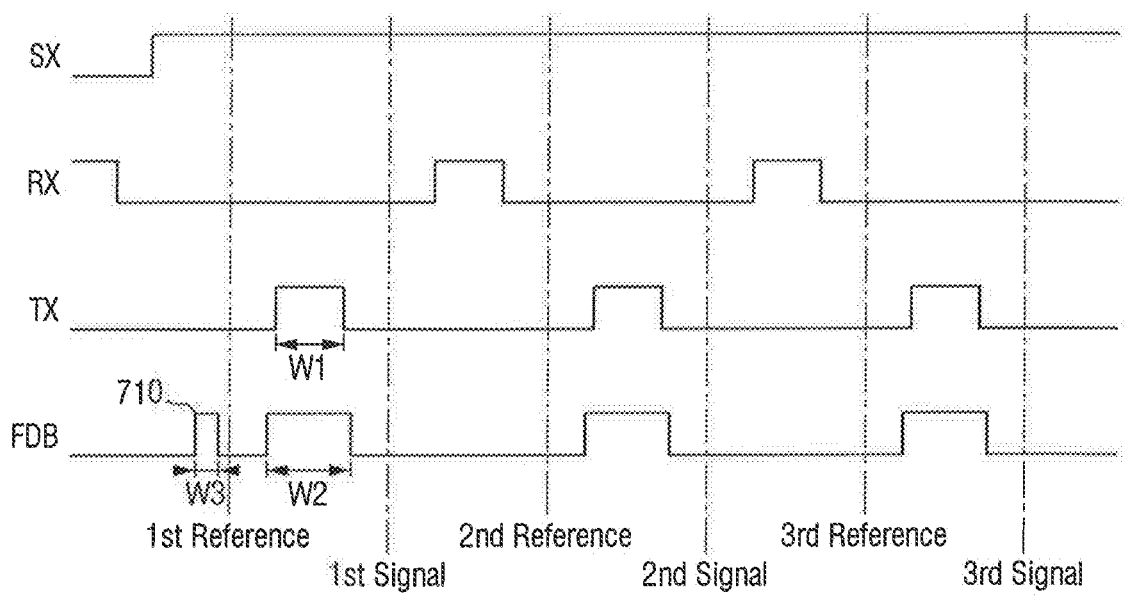
FIGS. 9 and 10 are diagrams for illustrating a method for performing an effective pre-boosting according to an exemplary embodiment of the present inventive concept.
Figure 10:
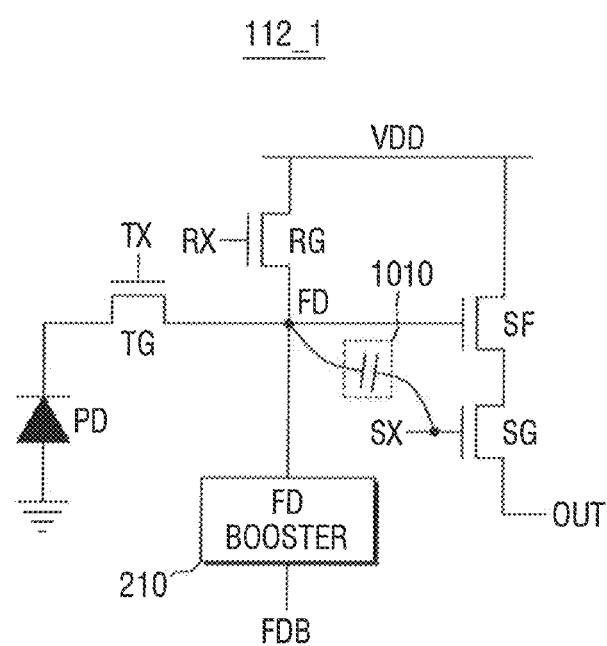

FIGS. 9 and 10 are diagrams for illustrating a method for performing an effective pre-boosting according to an exemplary embodiment of the present inventive concept.

Referring to FIG. 9, the reset transistor (RG) may be turned off before the selection transistor (SG) is turned on. In other words, after the voltage level of the reset signal (RX) changes from the high level to the low level, the voltage level of the selection signal (SX) may change from the low level to the high level.

Referring to FIG. 10, when the reset transistor (RG) is turned off, the floating diffusion node (FD) may be in a floating state. At this time, when the selection transistor (SG) is turned on, the voltage level of the selection signal (SX) may be changed from a low level to a high level. Therefore, a parasitic capacitor 1010 may be coupled between the line provided with the selection signal (SX) and the floating diffusion node (FD). Therefore, the voltage level of the floating diffusion node (FD) may be increased due to the parasitic capacitor 1010. When the voltage level of the floating diffusion node (FD) increases, the probability that the electrons 612 are trapped in the dielectric layer 610 before the transfer transistor (TG) is turned on may increase.

Figure 11:
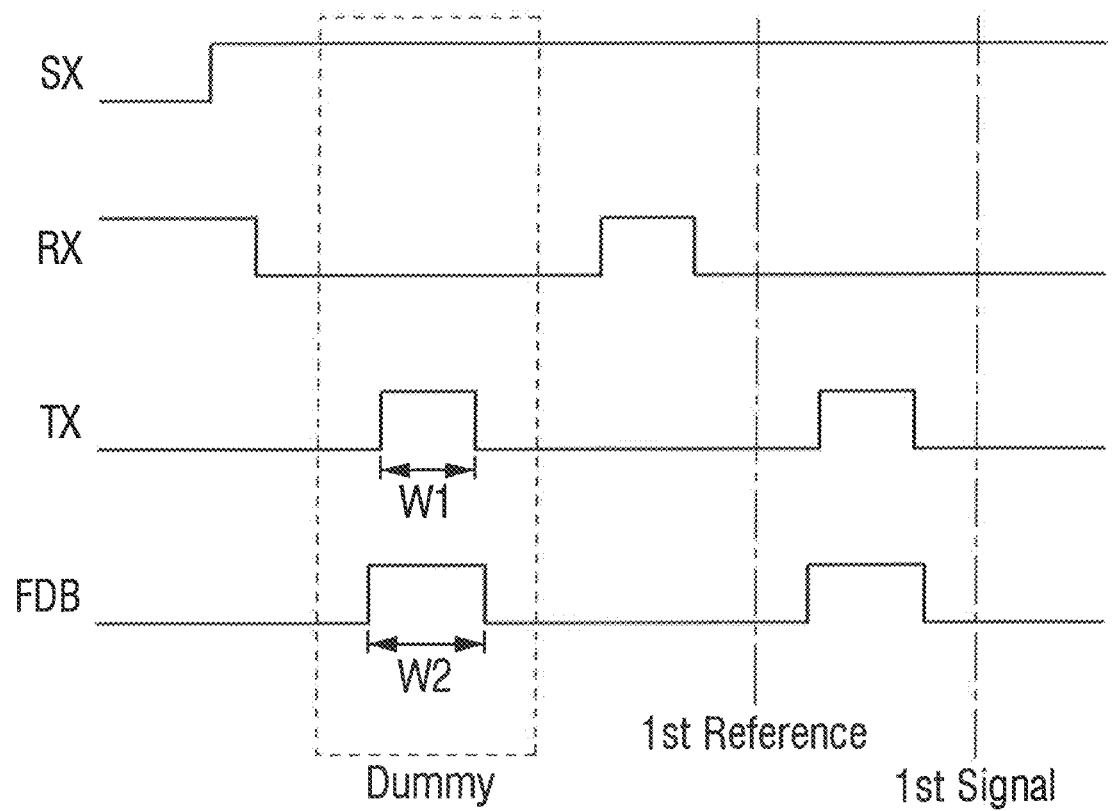
FIG. 11 is a diagram for describing a method for reducing RTS noise according to an exemplary embodiment of the present inventive concept.

FIG. 11 is a diagram for describing a method for reducing RTS noise according to an exemplary embodiment of the present inventive concept.

According to an exemplary embodiment of the present inventive concept, the first measurement may be treated as a dummy. In other words, by turning on the transfer transistor (TG) without executing the pre-boosting pulse 710, the electron 612 may be trapped in the dielectric layer 610. Thereafter, by turning on the reset transistor (RG), the voltage level of the floating diffusion node (FD) may be reset to the reference voltage level (VDD). At this time, the CDS 120 may receive the voltage level of the floating diffusion node (FD) as the first reference voltage (1st Reference). Thereafter, the transfer transistor (TG) may be turned on again. At this time, the CDS 120 may receive the voltage level of the floating diffusion node (FD) as the first signal voltage (1st Signal).

Figure 12:
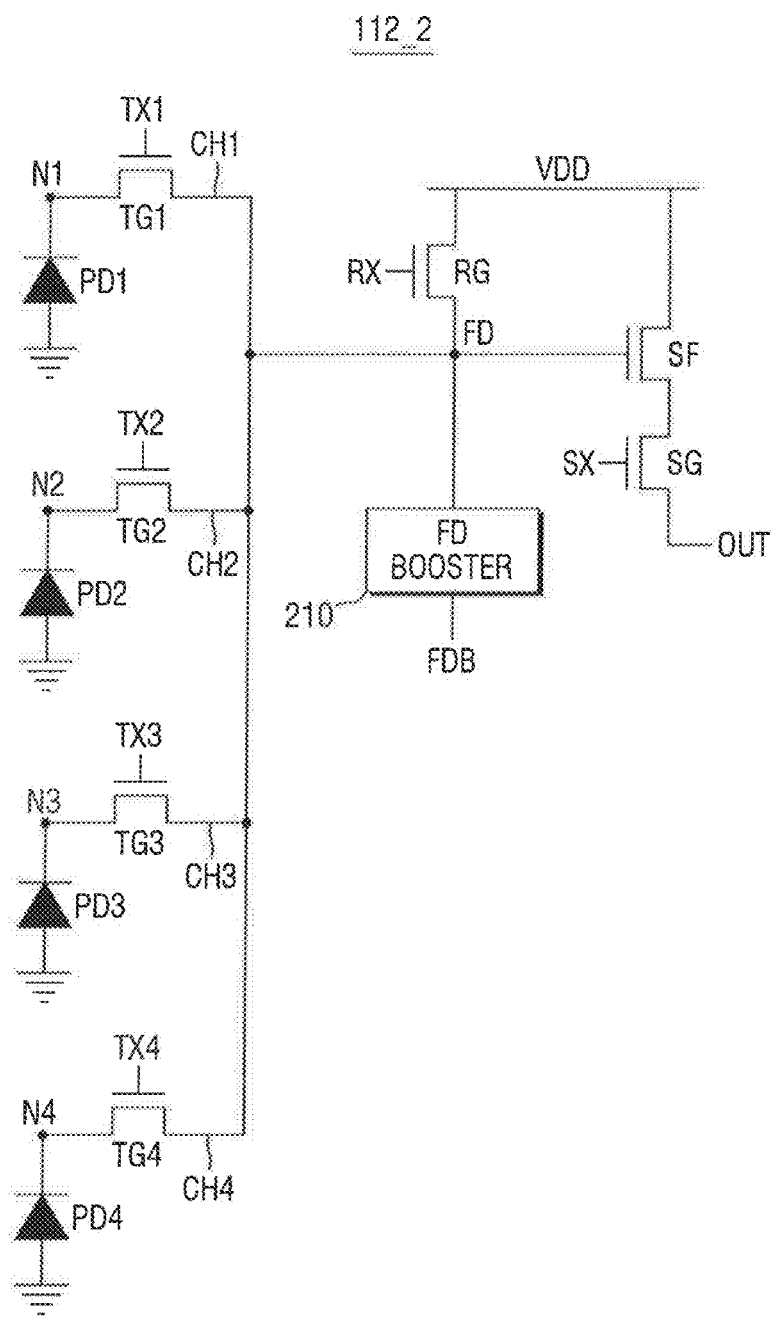
FIG. 12 is a circuit diagram for explaining the structure of a unit pixel according to an exemplary embodiment of the present inventive concept.
Figure 13:
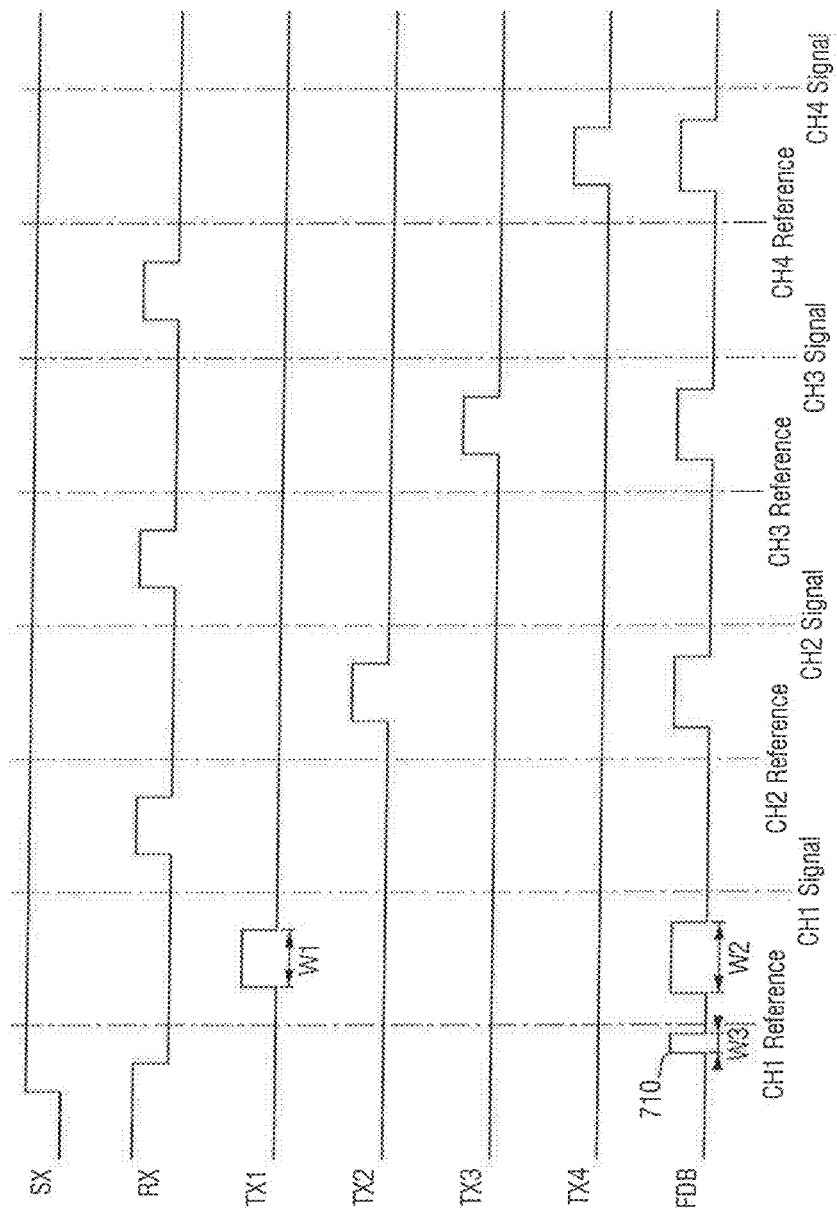
FIGS. 13 to 15 are timing diagrams for explaining the operation of the unit pixel of FIG. 12 according to an exemplary embodiment of the present inventive concept.
Figure 14:
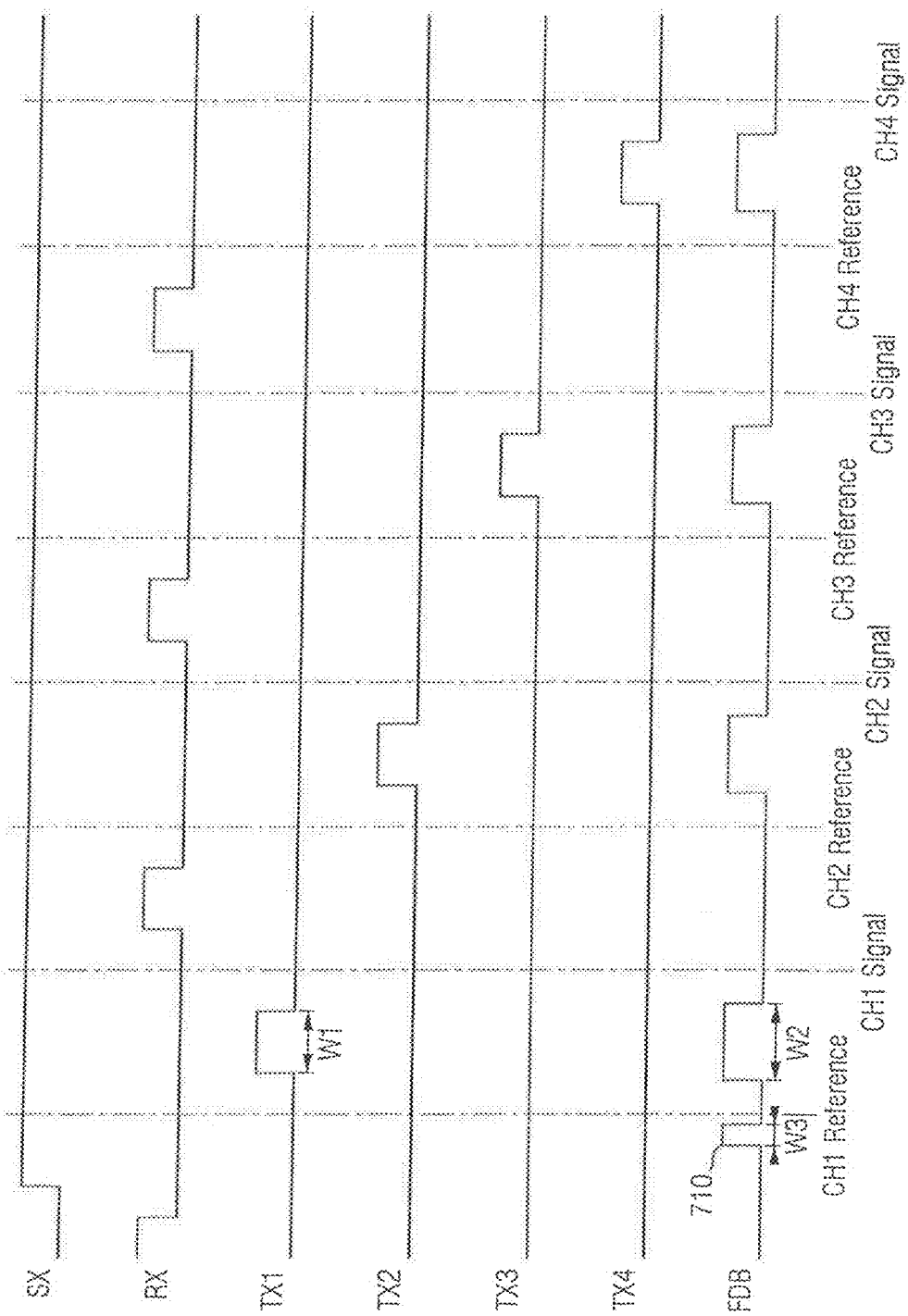
Figure 15:
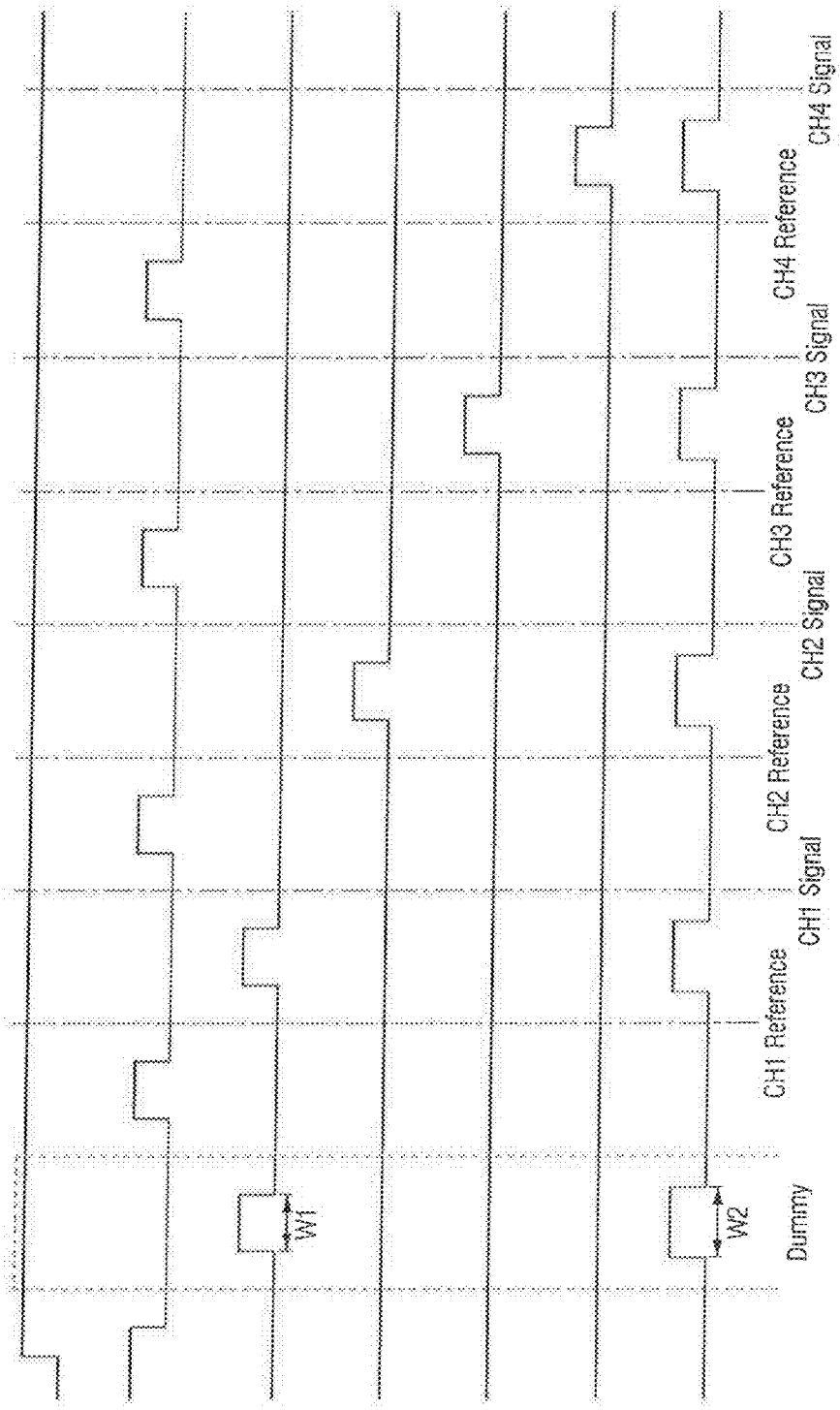

FIG. 12 is a circuit diagram for explaining the structure of a unit pixel according to an exemplary embodiment of the present inventive concept. FIGS. 13 to 15 are timing diagrams for explaining the operation of the unit pixel of FIG. 12 according to exemplary embodiments of the present inventive concept. For convenience of description, the same or similar content will be omitted or briefly explained.

Referring to FIG. 12, a unit pixel 112_2 according to an exemplary embodiment of the present inventive concept includes first to fourth photoelectric conversion units (PD1 to PD4), first to fourth transfer transistors (TG1 to TG4), the floating diffusion node (FD), the booster 210, the reset transistor (RG), the source follower transistor (SF), and the selection transistor (SG).

One end of the first to fourth photoelectric conversion units (PD1 to PD4) may be connected to the first to fourth nodes (N1 to N4), respectively. The other end of the first to fourth photoelectric conversion units (PD1 to PD4) may, for example, be grounded. The first to fourth transfer transistors (TG1 to TG4) may be connected between the first to fourth nodes (N1 to N4), respectively, and the floating diffusion node (FD).

For the sake of convenience, the first photoelectric conversion unit (PD1) and the first transfer transistor (TG1) are referred to as a first channel (CH1). The second photoelectric conversion unit (PD2) and the second transfer transistor (TG2) are referred to as a second channel (CH2). The third photoelectric conversion unit (PD3) and the third transfer transistor (TG3) are referred to as a third channel (CH3). The fourth photoelectric conversion unit (PD4) and the fourth transfer transistor (TG4) are referred to as a fourth channel (CH4).

Although FIG. 12 illustrates that each of the channels (CH1 to CH4) includes one photoelectric conversion unit and one transfer transistor, the present inventive concept is not limited thereto. For example, each of the channels (CH1 to CH4) may include a plurality of photoelectric conversion units and at least one transfer transistor.

Although FIG. 12 illustrates that the unit pixel 112_2 includes four channels, the present inventive concept is not limited thereto. For example, the unit pixel 112_2 may include eight channels.

In an exemplary embodiment of the present inventive concept, the first photoelectric conversion unit (PD1) may receive red (R) light. The second and third photoelectric conversion units (PD2, PD3) may receive green (G) light. The fourth photoelectric conversion unit (PD4) may receive blue (B) light.

In an exemplary embodiment of the present inventive concept, the first photoelectric conversion unit (PD1) may receive magenta (M) light. The second photoelectric conversion unit (PD2) may receive yellow (Y) light. The third photoelectric conversion unit (PD3) may receive cyan (C) light. The fourth photoelectric conversion unit (PD4) may receive white (W) light.

The first to fourth photoelectric conversion units (PD1 to PD4) may receive light of different wavelength bands, using color filters. For example, the first photoelectric conversion unit (PD1) may be disposed below a color filter that transmits only red (R) light. However, the present inventive concept is not limited thereto.

Referring to FIG. 13, when the selection transistor (SG) is turned on, the booster 210 may be enabled. Additionally, before the first transfer transistor (TG1) is turned on, the booster 210 may be disabled. In other words, when the voltage level of the selection signal (SX) changes from the low level to the high level, the boosting signal (FDB) may change from the low level to the high level. Further, before the voltage level of the first transfer signal (TX1) changes from the low level to the high level, the boosting signal (FDB) may change from the high level to the low level. In other words, the pre-boosting pulse 710 may be executed between the turn-on timing of the selection transistor (SG) and the turn-on timing of the first transfer transistor (TG1). As described above, electrons 612 may be trapped in the dielectric layer 610 of the source follower transistor (SF) due to the pre-boosting pulse 710.

The CDS 120 may receive a reference voltage (CH1 Reference) of the first channel (CH1). Although FIG. 13 illustrates a configuration in which the CDS 120 receives the reference voltage (CH1 Reference) of the first channel (CH1) just after executing the pre-boosting pulse 710, the present inventive concept is not limited thereto. For example, after executing the pre-boosting pulse 710, the reset transistor (RG) may be turned on and off. At this time, the CDS 120 may receive the reference voltage (CH1 Reference) of the first channel (CH1).

The first transfer transistor TG1 may be turned on and off. The CDS 120 may receive a signal voltage (CH1 Signal) of the first channel (CH1).

The floating diffusion node (FD) may be reset to the reference voltage level (VDD), using the reset transistor (RG). At this time, the CDS 120 may receive a reference voltage (CH2 Reference) of the second channel (CH2). Thereafter, the second transfer transistor (TG2) may be turned on and off. At this time, the CDS 120 may receive a signal voltage (CH2 Signal) of the second channel (CH2).

By performing substantially the same process, the CDS 120 may receive a reference voltage (CH3 Reference) of the third channel (CH3) and a signal voltage (CH3 Signal) of the third channel (CH3). Likewise, the CDS 120 may receive a fourth reference voltage (CH4 Reference) and a fourth signal voltage (CH4 Signal).

Referring to FIG. 14, before the selection transistor (SG) is turned on, the reset transistor (RG) may be turned off. In other words, the voltage level of the reset signal (RX) may be changed from the high level to the low level, and the voltage level of the selection signal (SX) may be changed from the low level to the high level. As described above, when the reset transistor (RG) is turned off before the selection transistor (SG) is turned on, the parasitic capacitor 1010 may be coupled between the gate of the selection transistor (SG) and the floating diffusion node (FD). At this time, the voltage level (VFD) of the floating diffusion node (FD) may be increased by the parasitic capacitor 1010. Since the voltage level (VFD) of the floating diffusion node (FD) is increased, the probability that electrons 612 are trapped in the dielectric layer 610 of the source follower transistor (SF) may increase.

Referring to FIG. 15, after the selection transistor (SG) is turned on, the first transfer transistor (TG1) may be turned on and off. In other words, after the voltage level of the selection signal (SX) changes from the low level to the high level, the voltage level of the first transfer signal (TX1) may be changed from the low level to the high level and may be changed to the low level again. This process is treated as a dummy (Dummy), and the CDS 120 may not change the output voltage to a digital code.

Thereafter, the reset transistor (SG) may be turned on and off. At this time, the CDS 120 may receive the reference voltage (CH1 Reference) of the first channel (CH1). Subsequently, the first transfer transistor (TG1) may be turned on and off again. At this time, the CDS 120 may receive the signal voltage (CH1 Signal) of the first channel (CH1). Subsequently, the CDS 120 may receive the reference voltage (CH2 Reference) of the second channel (CH2), the signal voltage (CH2 Signal) of the second channel (CH2), the reference voltage (CH3 Reference) of the third channel (CH3), the signal voltage (CH3 Signal) of the third channel (CH3), the reference voltage (CH4 Reference) of the fourth channel (CH4), and the signal voltage (CH4 Signal) of the fourth channel (CH4).

Figure 16A:
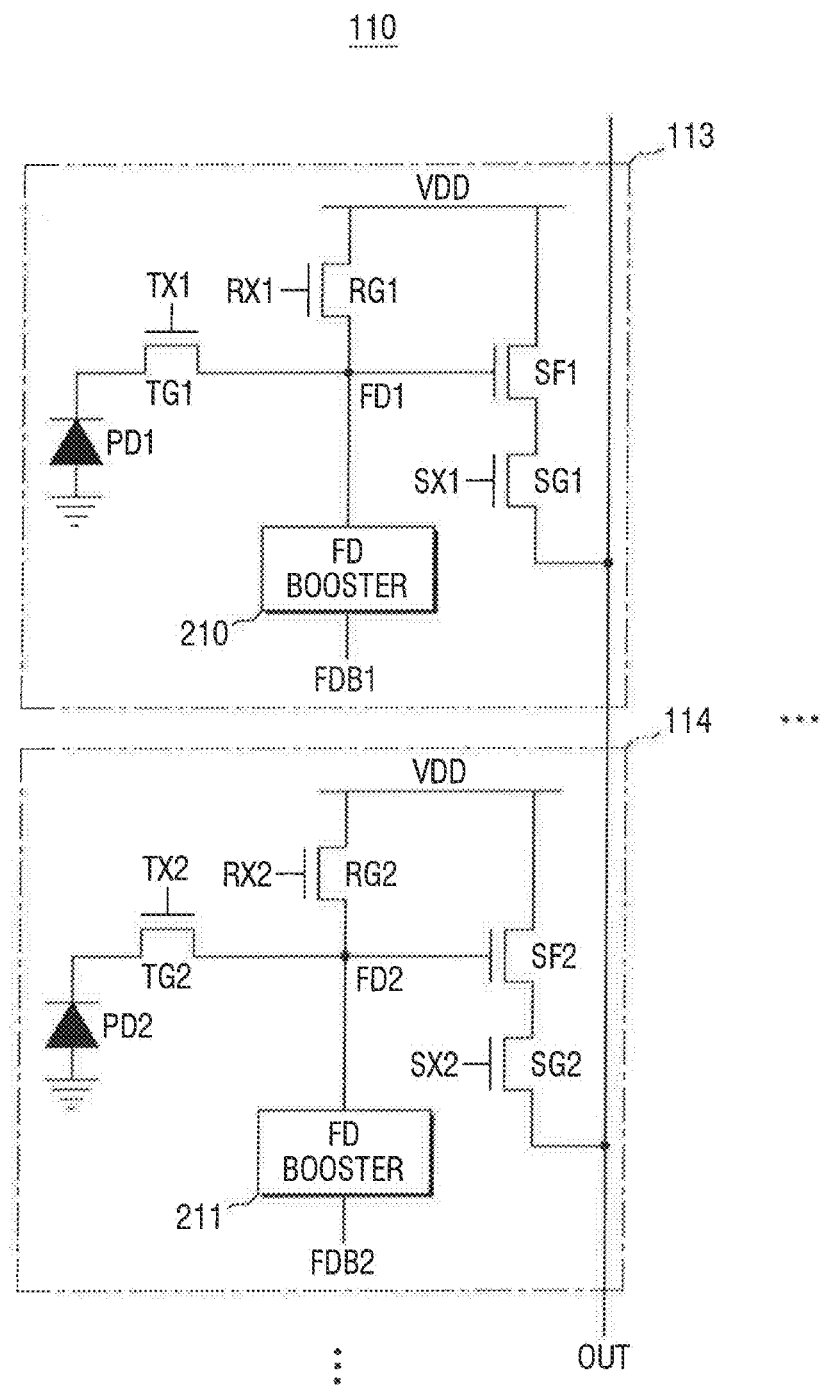
FIG. 16A is a circuit diagram for explaining the operation of a pixel array of FIG. 1 according to an exemplary embodiment of the present inventive concept.
Figure 16B:
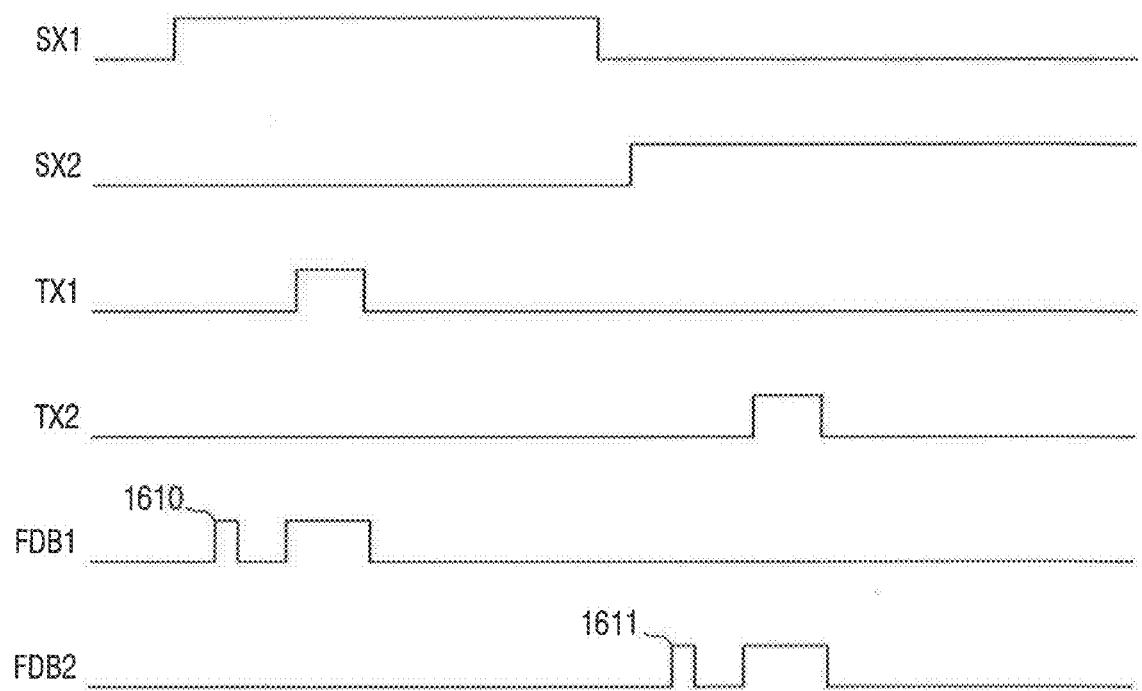
FIG. 16B is a timing diagram for explaining the operation of the pixel array of FIG. 1 according to an exemplary embodiment of the present inventive concept.

FIG. 16A is a circuit diagram for explaining the operation of a pixel array of FIG. 1 according to an exemplary embodiment of the present inventive concept. FIG. 16B is a timing diagram for explaining the operation of the pixel array according to an exemplary embodiment of the present inventive concept. For convenience of description, the same or similar contents will be omitted or briefly explained.

Referring to FIG. 16A, the pixel array 110 according to an exemplary embodiment of the present inventive concept may include a first pixel 113 and a second pixel 114. It is assumed that the first and second pixels 113 and 114 have substantially the same configuration as that of the unit pixel 112_1 of FIG. 2.

The first pixel 113 may include a first photoelectric conversion unit (PD1), a first transfer transistor (TG1), a first floating diffusion node (FD1), a first reset transistor (RG1), a first source follower transistor (SF1), a first selection transistor (SG1), and a first booster 210. The second pixel 114 may include a second photoelectric conversion unit (PD2), a second transfer transistor (TG2), a second floating diffusion node (FD2), a second reset transistor (RG2), a second source follower transistor (SF2), a second selection transistor (SG2), and a second booster 211. The outputs of the first pixel 113 and the second pixel 114 may be connected to the same output line (OUT).

The first booster 210 may be enabled/disabled by a first boosting signal (FDB1). Further, the second booster 211 may be enabled/disabled by a second boosting signal (FDB2).

Referring to FIG. 16B, the first booster 210 may execute a first pre-boosting 1610 between the turn-on timing of the first selection transistor (SG1) and the turn-on timing of the first transfer transistor (TG1). Further, the second booster 211 may execute a second pre-boosting 1611 between the turn-on timing of the second selection transistor (SG2) and the turn-on timing of the second transfer transistor (TG2). In other words, when the voltage level of the first selection signal (SX1) changes from the low level to the high level, the voltage level of the first boosting signal (FDB1) may change from the low level to the high level. Before the voltage level of the first transfer signal (TX1) changes from the low level to the high level, the voltage level of the first boosting signal (FDB1) may change from the high level to the low level. Additionally, when the voltage level of the second selection signal (SX2) changes from the low level to the high level, the voltage level of the second boosting signal (FDB2) may change from the low level to the high level. Before the voltage level of the second transfer signal (TX2) changes from the low level to the high level, the voltage level of the second boosting signal (FDB2) may change from the high level to the low level.

Figure 17A:
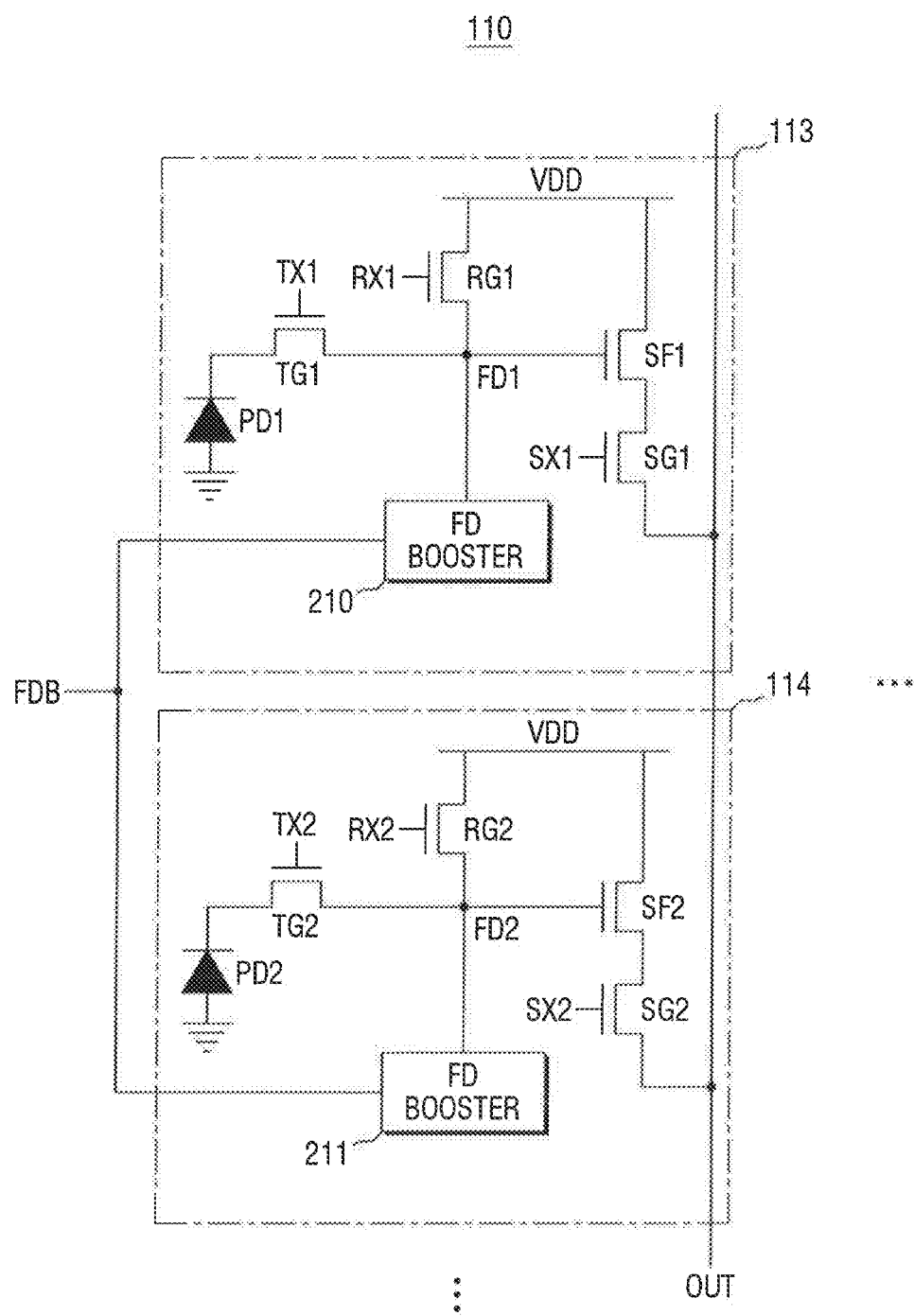
FIG. 17A is a circuit diagram for explaining the operation of the pixel array of FIG. 1 according to an exemplary embodiment of the present inventive concept.
Figure 17B:
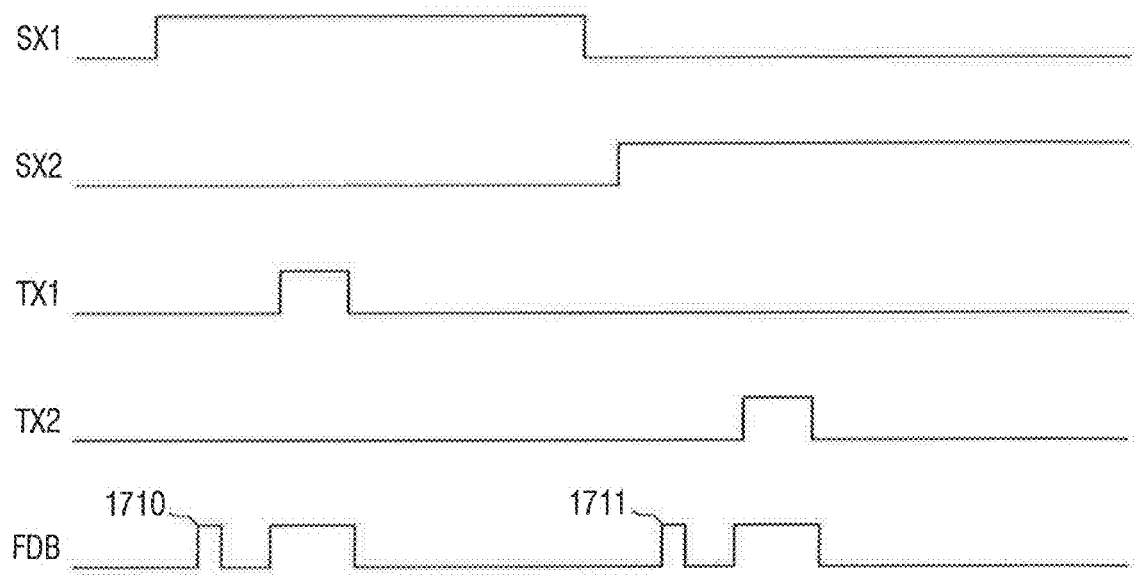
FIG. 17B is a timing diagram for explaining the operation of the pixel array of FIG. 1 according to an exemplary embodiment of the present inventive concept.

FIG. 17A is a circuit diagram for explaining the operation of the pixel array of FIG. 1 according to an exemplary embodiment of the present inventive concept. FIG. 17B is a timing diagram for explaining the operation of the pixel array of FIG. 1 according to an exemplary embodiment of the present inventive concept. For convenience of description, the same or similar contents will be omitted or briefly explained.

Referring to FIG. 17A, the pixel array 110 according to an exemplary embodiment of the present inventive concept may include the first pixel 113 and the second pixel 114. It is assumed that the first and second pixels 113 and 114 have substantially the same configuration as the unit pixel 112_1 of FIG. 2.

In the first and second pixels 113 and 114 of FIG. 17a, unlike FIG. 16A, the first and second boosters 210 and 211 may be controlled by the same boosting signal.

Referring to FIG. 17B, the first booster 210 may execute a first pre-boosting 1710 between the turn-on timing of the first selection transistor (SG1) and the turn-on timing of the first transfer transistor (TG1). Further, the second booster 211 may execute a second pre-boosting 1711 between the turn-on timing of the second selection transistor (SG2) and the turn-on timing of the second transfer transistor (TG2). In other words, when the voltage level of the first selection signal (SX1) changes from the low level to the high level, the voltage level of the boosting signal (FDB) may change from the low level to the high level. Before the voltage level of the first transfer signal (TX1) changes from the low level to the high level, the voltage level of the boosting signal (FDB) may change from the high level to the low level. Further, when the voltage level of the second selection signal (SX2) changes from the low level to the high level, the voltage level of the boosting signal (FDB) may change from the low level to the high level. Before the voltage level of the second transfer signal (TX2) changes from the low level to the high level, the voltage level of the boosting signal (FDB) may change from the high level to the low level.

While the present inventive concept has been shown and described with reference to exemplary embodiments thereof, it will be apparent to those of ordinary skill in the art that various modifications in form and details may be made thereto without materially departing from the spirit and scope of the inventive concept as set forth by the following claims.

What is claimed is:

1. An image sensor comprising:
    a photoelectric conversion unit configured to receive light to generate an electric charge and provide the electric charge to a first node;
    a transfer transistor configured to provide a voltage level of the first node to a floating diffusion node in response to a first signal;
    a booster configured to increase a voltage level of the floating diffusion node in response to a second signal;
    a source follower transistor configured to provide the voltage level of the floating diffusion node to a second node; and
    a selection transistor configured to provide a voltage level of the second node to a pixel output terminal in response to a third signal,
    wherein, in a first cyclic phase after the selection transistor is turned on, the booster is enabled and disabled before the transfer transistor is turned on,
    wherein, in a second cyclic phase after the first cyclic phase, the booster is enabled before the transfer transistor is turned off, and the transfer transistor is turned on before the booster is disabled.

2. The image sensor of claim 1, wherein, before the transfer transistor is turned on, the booster is enabled, and after the transfer transistor is turned off, the booster is disabled.

3. The image sensor of claim 1, wherein the source follower transistor comprises a source/drain region connected to a voltage source, a gate insulating film, and a gate region, and
    the booster is enabled after the selection transistor is turned on, and the booster is disabled before the transfer transistor is turned on, to increase a probability of an electron trap on the gate insulating film.

4. The image sensor of claim 1, further comprising:
    a reset transistor configured to reset the floating diffusion node to a reference voltage level in response to a fourth signal,
    wherein the fourth signal is reduced earlier than a time point at which the third signal increases.

5. The image sensor of claim 4, wherein the selection transistor is gated to a selection line, and
    the fourth signal is provided to the selection line.

6. The image sensor of claim 5, wherein, the floating diffusion node is in a floating state in response to the fourth signal decreasing, and
    the floating diffusion node and the selection line are coupled due to a parasitic capacitor between the floating diffusion node and the selection line, and the voltage level of the floating diffusion node increases in response to the third signal increasing.

7. The image sensor of claim 1, wherein the booster comprises a capacitor, and
    the booster and the floating diffusion node are coupled by the capacitor in accordance with the third signal, and the voltage level of the floating diffusion node increases.

8. An image sensor comprising:
a photoelectric conversion unit configured to receive light to generate an electric charge and provide the electric charge to a first node;
a transfer transistor which is connected to the first node and a floating diffusion node and gated by a first signal;
a booster which has an input terminal to which a second signal is provided, and an output terminal connected to the floating diffusion node, wherein the booster increases a voltage level of the floating diffusion node in response to the second signal;
a source follower transistor connected to a second node and a first voltage source and gated to the floating diffusion node;
a selection transistor which is connected to a pixel output terminal and the second node and gated by a third signal,
wherein, a voltage level of the third signal changes from a low level to a high level at a first time,
wherein after the first time a voltage level of the second signal changes from the low level to the high level,
wherein a voltage level of the second signal changes from the high level to the low level at a second time, after the first time,
wherein a voltage level of the first signal changes from the low level to the high level at a third time, after the second time,
wherein between the second time and the third time, the voltage level of the second signal changes from the low level to the high level, and
wherein the voltage level of the second signal changes from the high level to the low level after the voltage level of the first signal changes from the high level to the low level.

9. The image sensor of claim 8, wherein, before the voltage level of the first signal changes from the low level to the high level, the voltage level of the second signal changes from the low level to the high level, and
after the voltage level of the first signal changes from the high level to the low level, the voltage level of the second signal changes from the high level to the low level.

10. The image sensor of claim 8, wherein the source follower transistor comprises a source/drain region connected to a reference voltage level, a gate insulating film, and a gate region, and
after the voltage level of the third signal changes from the low level to the high level, the voltage level of the second signal changes from the low level to the high level, and before the voltage level of the first signal changes from the low level to the high level, the voltage level of the second signal changes from the high level to the low level, thereby increasing a probability of an electron trap in the gate insulating film.

11. The image sensor of claim 8, further comprising:
a reset transistor which is connected to the floating diffusion node and the first voltage source and gated by a fourth signal,
wherein, after a voltage level of the fourth signal changes from the high level to the low level, the voltage level of the third signal changes from the low level to the high level.

12. The image sensor of claim 11, wherein the selection transistor is gated to a selection line, and
the third signal is provided to the selection line.

13. The image sensor of claim 12, wherein, the floating diffusion node is in a floating state in response to the voltage level of the fourth signal changing from the high level to the low level, and
the floating diffusion node and the selection line are coupled due to a parasitic capacitor between the floating diffusion node and the selection line, and the voltage level of the floating diffusion node increases, in response to the voltage level of the third signal changing from the low level to the high level.

14. The image sensor of claim 8, further comprising:
a shutter transistor connected to the first node and the first voltage source.

15. The image sensor of claim 8, wherein the booster includes a capacitor, and
the booster and the floating diffusion node are coupled by the capacitor in accordance with the voltage level of the third signal, and the voltage level of the floating diffusion node increases.

16. An image sensor comprising:
a first pixel which includes a first photoelectric conversion unit, a first transfer transistor connected between the first photoelectric conversion unit and a first floating diffusion node, and a first booster configured to boost the first floating diffusion node;
a second pixel which includes a second photoelectric conversion unit, a second transfer transistor connected between the second photoelectric conversion unit and a second floating diffusion node, and a second booster configured to boost the second floating diffusion node;
a correlated double sampler; and
a pixel selection unit configured to select a pixel among the first and second pixels to provide an output voltage of the selected pixel to the correlated double sampler,
wherein, if the selected pixel is the first pixel and before an output voltage of the first pixel is provided to the correlated double sampler, the first booster pre-boosts the first floating diffusion node before the first transfer transistor connects and stops pre-boost after the first transfer transistor disconnects, and
if the selected pixel is the second pixel and before an output voltage of the second pixel is provided to the correlated double sampler, the second booster pre-boosts the second floating diffusion node before the second transfer transistor connects and stops pre-boost after the second transfer transistor disconnects.

17. The image sensor of claim 16, wherein:
the first booster boosts the first floating diffusion node in response to the first transfer transistor being turned on, and
the second booster boosts the second floating diffusion node in response to the second transfer transistor being turned on.

18. The image sensor of claim 16, at least one of the first or second pixels further comprising:
a source follower transistor connected between a second node and a first voltage source and gated to the respective floating diffusion node;
a selection transistor connected between a pixel output terminal and the second node,
wherein after the selection transistor is connected, the respective booster pre-boosts the respective floating diffusion node, and
wherein pre-boosting of the first or second floating diffusion nodes increases a probability of an electron trap.

19. The image sensor of claim 16, wherein the first pixel further comprises a first reset transistor connected to the first floating diffusion node, the second pixel further comprises a second reset transistor connected to the second floating diffusion node, and the first and second reset transistors are turned off before the pixel selection unit selects one of the first and second pixels.

20. The image sensor of claim 16, wherein each of the first and second boosters includes a capacitor, the capacitor of the first booster and the first floating diffusion node are coupled under the control of the first booster, and the first floating diffusion node is boosted, and the capacitor of the second booster and the second floating diffusion node are coupled under the control of the second booster, and the second floating diffusion node is boosted.

* * * * *